(12) United States Patent
Miyagawa

(10) Patent No.: US 8,937,580 B2
(45) Date of Patent: Jan. 20, 2015

(54) DRIVING METHOD OF LIGHT EMITTING DEVICE AND LIGHT EMITTING DEVICE

(75) Inventor: Keisuke Miyagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 682 days.

(21) Appl. No.: 10/902,811

(22) Filed: Aug. 2, 2004

(65) Prior Publication Data

US 2005/0030265 A1 Feb. 10, 2005

(30) Foreign Application Priority Data

Aug. 8, 2003 (JP) ................................ 2003-289569

(51) Int. Cl.
*G09G 3/30* (2006.01)
*G09G 3/32* (2006.01)
*G09G 3/20* (2006.01)

(52) U.S. Cl.
CPC ............ *G09G 3/3233* (2013.01); *G09G 3/3258* (2013.01); *G09G 3/2022* (2013.01); *G09G 3/3291* (2013.01); *G09G 2300/0842* (2013.01); *G09G 2300/0866* (2013.01); *G09G 2310/0256* (2013.01); *G09G 2310/0262* (2013.01)
USPC .............................. 345/76; 345/77; 315/169.3

(58) Field of Classification Search
USPC .............................. 345/76–77, 80, 83, 44–46; 315/169.1–169.3
See application file for complete search history.

(56) References Cited

U.S. PATENT DOCUMENTS

| 4,409,134 A | 10/1983 | Yamazaki |
| 5,670,792 A * | 9/1997 | Utsugi et al. ..................... 257/59 |
| 6,229,506 B1 * | 5/2001 | Dawson et al. .................. 345/82 |
| 6,380,689 B1 | 4/2002 | Okuda |
| 6,529,178 B1 * | 3/2003 | Kimura ........................... 345/76 |
| 6,677,713 B1 | 1/2004 | Sung |
| 6,680,580 B1 | 1/2004 | Sung |
| 6,731,276 B1 * | 5/2004 | Ishizuka ....................... 345/211 |
| 6,734,636 B2 * | 5/2004 | Sanford et al. ............. 315/169.3 |

(Continued)

FOREIGN PATENT DOCUMENTS

| CN | 1388504 | 1/2003 |
| JP | 10312173 A | 11/1998 |

(Continued)

OTHER PUBLICATIONS

Sanford et al., "TFT AMOLED Pixel Circuits and Driving Methods", SID Digest '03: SID International Symposium Digest of Technical Papers, May 2003, pp. 10-13.

*Primary Examiner* — Jason Mandeville
(74) *Attorney, Agent, or Firm* — Fish & Richardson P.C.

(57) ABSTRACT

A driving method of a light emitting device, in which when an N-type driving TFT is connected to an anode of a light emitting element or a P-type driving TFT is connected to a cathode thereof, the driving TFT operates in a saturation region and an image can be displayed with a desired gray scale level depending on a video signal. In addition, a light emitting device adopting the driving method is provided. According to the invention, when a potential having image data is supplied to a gate of a driving TFT depending on a video signal, a reverse bias voltage is applied to the driving TFT and a light emitting element which are connected in series with each other. Meanwhile, when a pixel displays an image depending on the video signal, a forward bias voltage is applied to the driving TFT and the light emitting element.

15 Claims, 21 Drawing Sheets

(56) References Cited

U.S. PATENT DOCUMENTS

| | | | |
|---|---|---|---|
| 6,738,034 B2* | 5/2004 | Kaneko et al. | 345/76 |
| 6,750,833 B2* | 6/2004 | Kasai | 345/76 |
| 6,864,863 B2* | 3/2005 | Kasai | 345/39 |
| 6,872,973 B1 | 3/2005 | Koyama et al. | |
| 6,873,313 B2* | 3/2005 | Washio et al. | 345/100 |
| 6,954,194 B2 | 10/2005 | Matsumoto et al. | |
| 7,167,169 B2* | 1/2007 | Libsch et al. | 345/211 |
| 7,170,094 B2* | 1/2007 | Yamazaki et al. | 345/102 |
| 7,205,967 B2* | 4/2007 | Morishige et al. | 345/77 |
| 7,230,591 B2 | 6/2007 | Inukai | |
| 7,317,429 B2 | 1/2008 | Shirasaki et al. | |
| 7,317,433 B2* | 1/2008 | Chen et al. | 345/76 |
| 7,348,942 B2* | 3/2008 | Jo | 345 |
| 7,365,719 B2* | 4/2008 | Miyagawa | 345/82 |
| 7,515,121 B2* | 4/2009 | Sato et al. | 345/76 |
| 7,564,433 B2* | 7/2009 | Hector et al. | 345/82 |
| 7,876,294 B2 | 1/2011 | Sasaki et al. | |
| 8,519,918 B2 | 8/2013 | Sasaki et al. | |
| 2001/0035863 A1* | 11/2001 | Kimura | 345/205 |
| 2001/0038367 A1* | 11/2001 | Inukai | 345/76 |
| 2002/0047568 A1 | 4/2002 | Koyama | |
| 2002/0047839 A1* | 4/2002 | Kasai | 345/211 |
| 2002/0180671 A1* | 12/2002 | Inukai | 345/76 |
| 2002/0195968 A1 | 12/2002 | Sanford et al. | |
| 2003/0020413 A1* | 1/2003 | Oomura | 315/169.3 |
| 2003/0062545 A1* | 4/2003 | Yamazaki et al. | 257/200 |
| 2003/0103022 A1 | 6/2003 | Noguchi et al. | |
| 2003/0107565 A1* | 6/2003 | Libsch et al. | 345/211 |
| 2003/0112205 A1 | 6/2003 | Yamada | |
| 2003/0160745 A1* | 8/2003 | Osame et al. | 345/82 |
| 2003/0189535 A1 | 10/2003 | Matsumoto et al. | |
| 2004/0090186 A1* | 5/2004 | Yoshida et al. | 315/169.1 |
| 2004/0179005 A1* | 9/2004 | Jo | 345/211 |
| 2004/0246241 A1* | 12/2004 | Sato et al. | 345/204 |
| 2004/0256617 A1* | 12/2004 | Yamada et al. | 257/59 |
| 2005/0001830 A1* | 1/2005 | Osame et al. | 345/211 |
| 2005/0083270 A1* | 4/2005 | Miyazawa | 345/76 |
| 2005/0253531 A1 | 11/2005 | Matsumoto et al. | |
| 2006/0077134 A1* | 4/2006 | Hector et al. | 345/76 |
| 2010/0328294 A1 | 12/2010 | Sasaki et al. | |

FOREIGN PATENT DOCUMENTS

| | | |
|---|---|---|
| JP | 2000268957 A | 9/2000 |
| JP | 2001-109432 A | 4/2001 |
| JP | 2002-108285 | 4/2002 |
| JP | 2002-358048 A | 12/2002 |
| JP | 2003173154 A | 6/2003 |
| JP | 2003-195810 A | 7/2003 |
| JP | 2003186437 A | 7/2003 |
| JP | 2003-255897 A | 9/2003 |
| WO | 03/058328 A1 | 7/2003 |

\* cited by examiner

FIG. 1A WRITING PERIOD (DURING APPLICATION OF REVERSE BIAS)
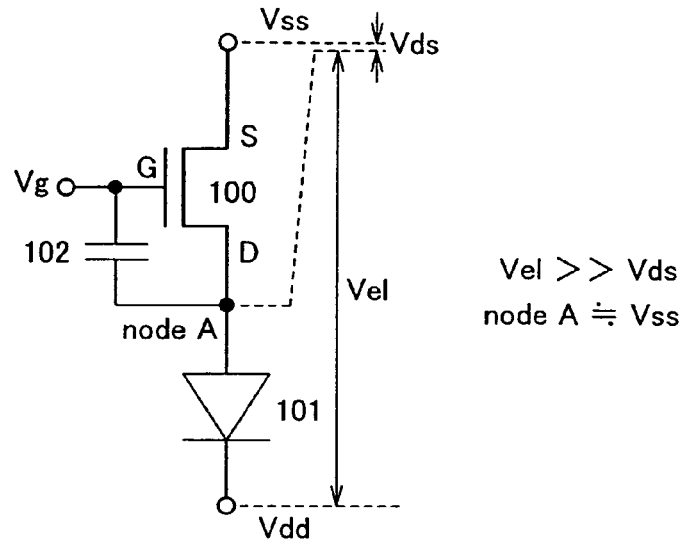
$Vel \gg Vds$
node $A \doteqdot Vss$
FIG. 1B DISPLAY PERIOD (DURING APPLICATION OF FORWARD BIAS)
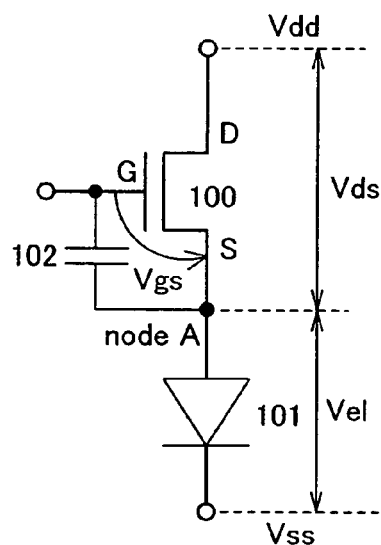

FIG. 3A
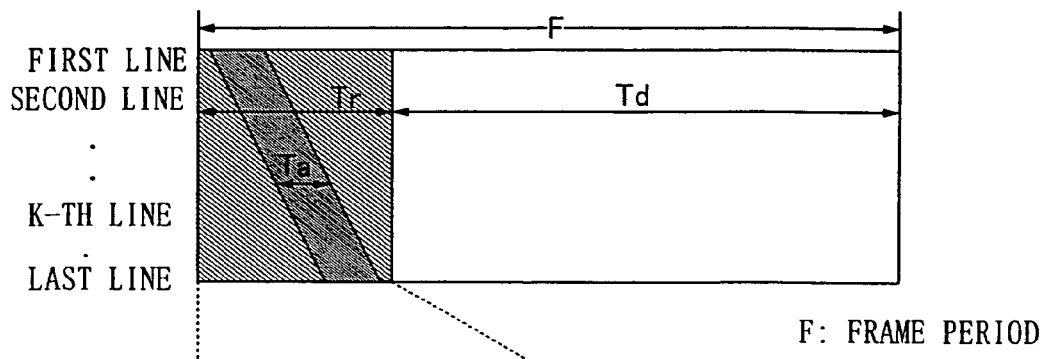
F: FRAME PERIOD
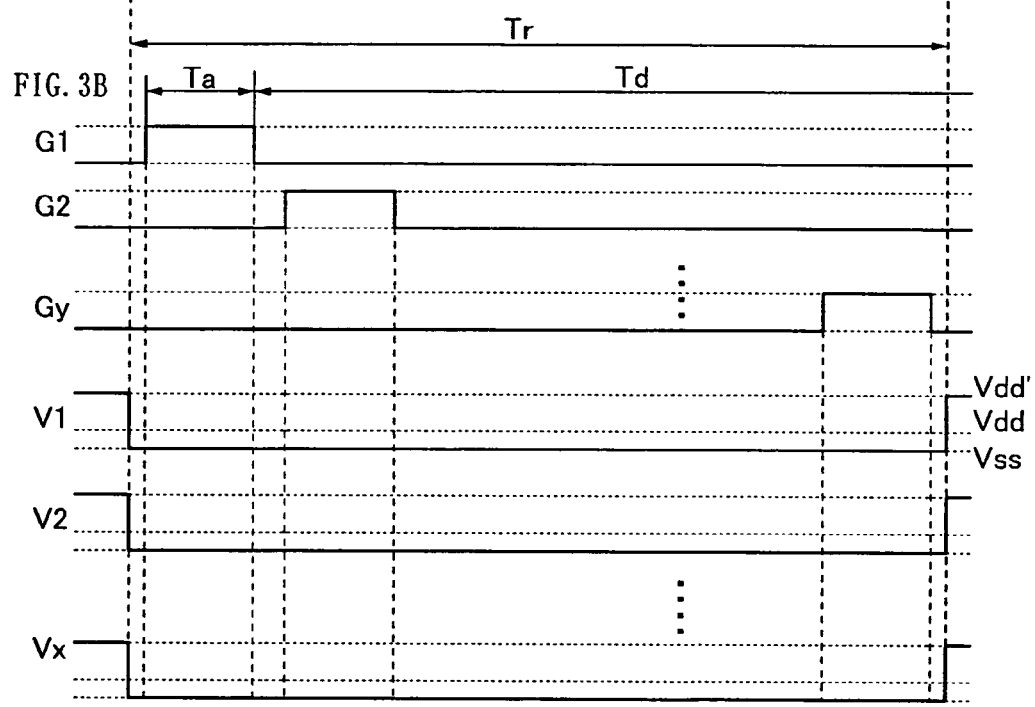
FIG. 3B

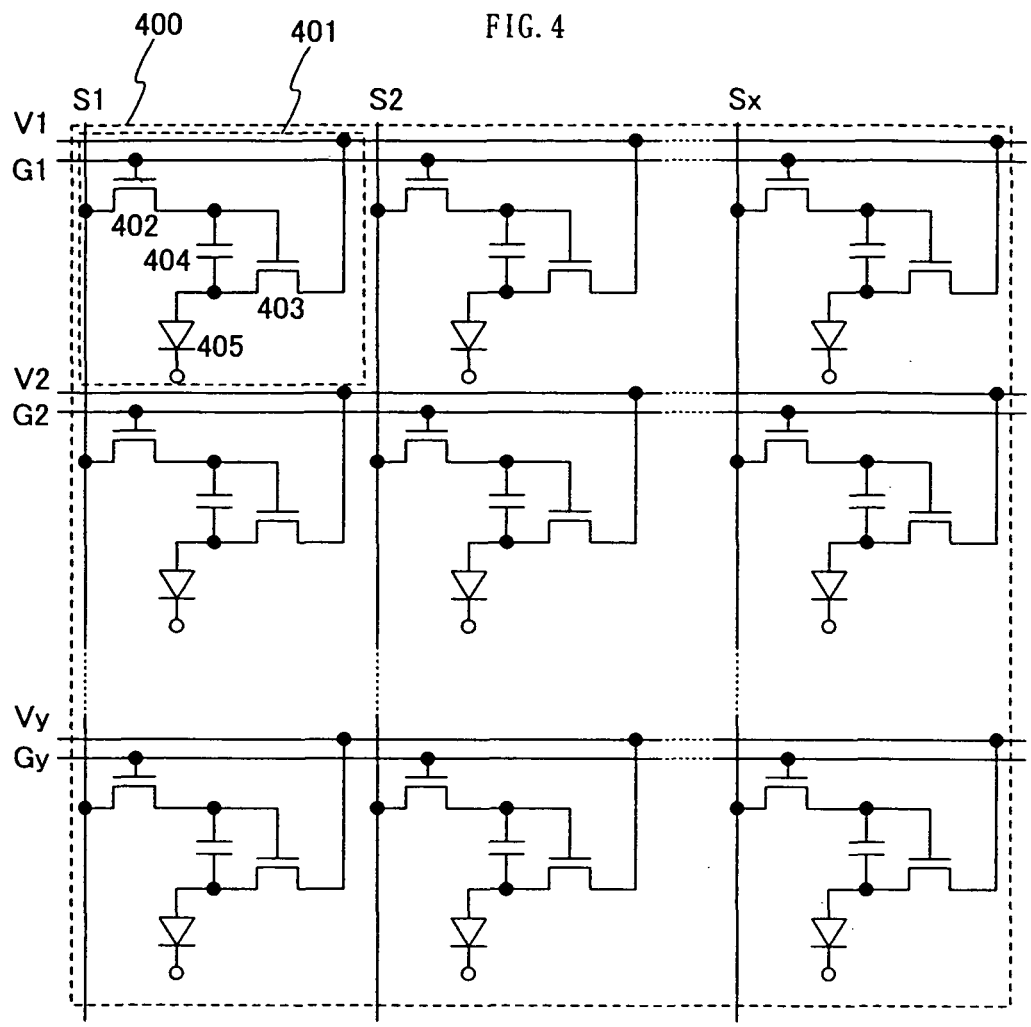

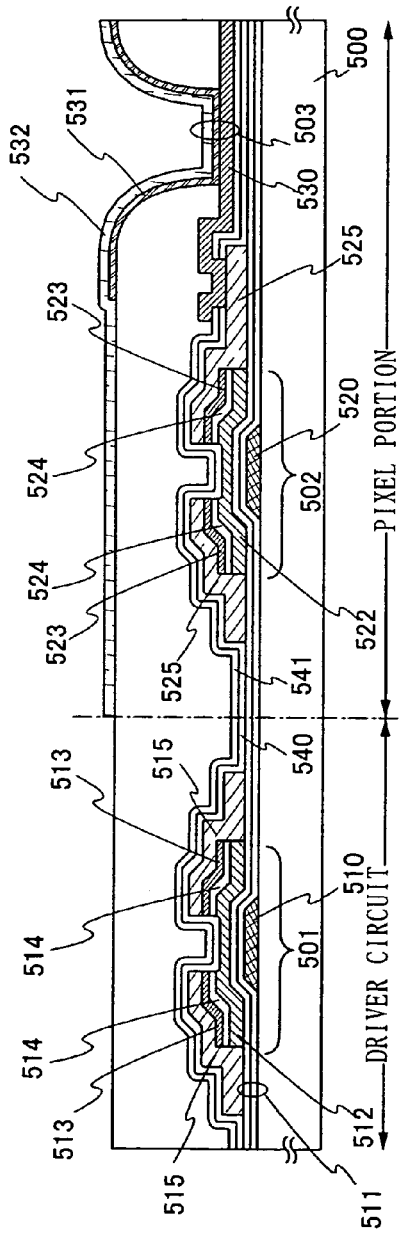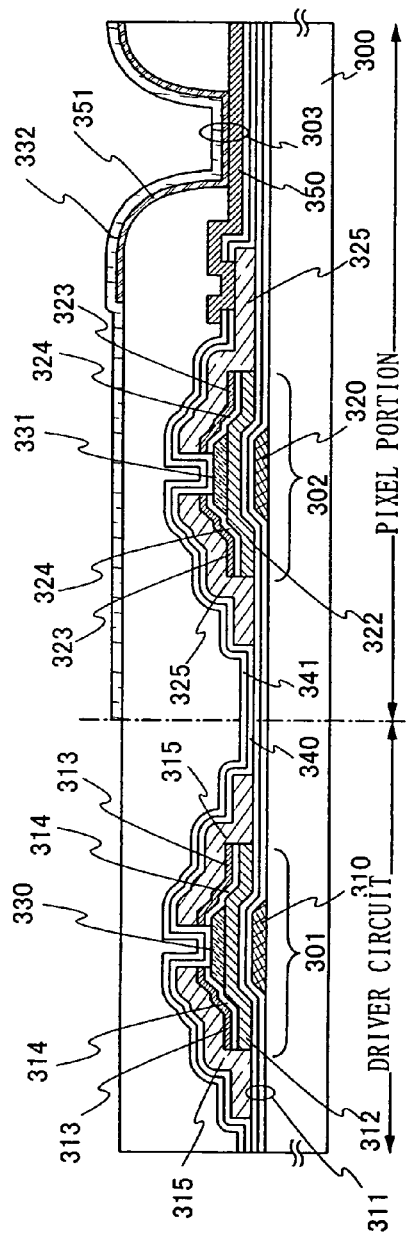

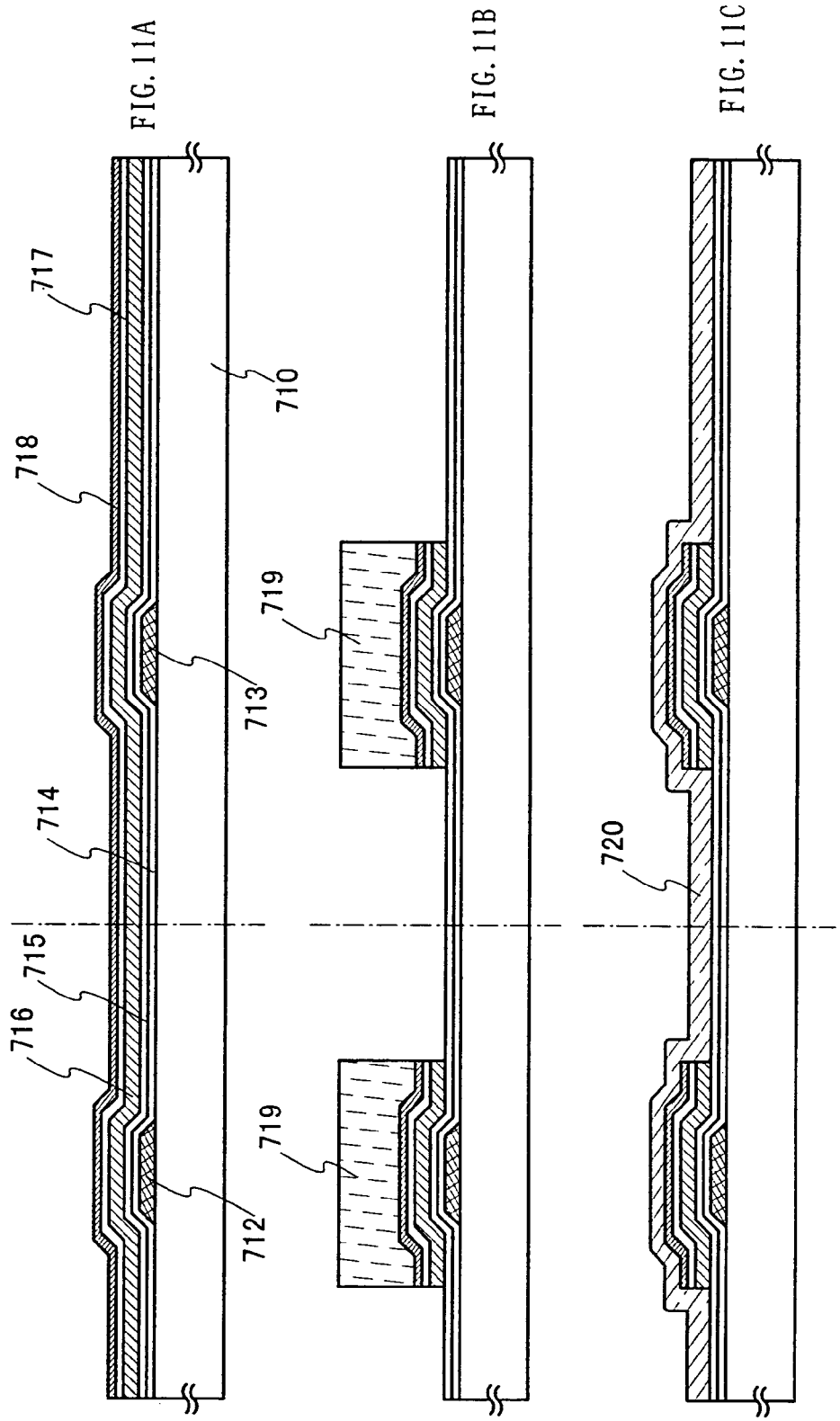

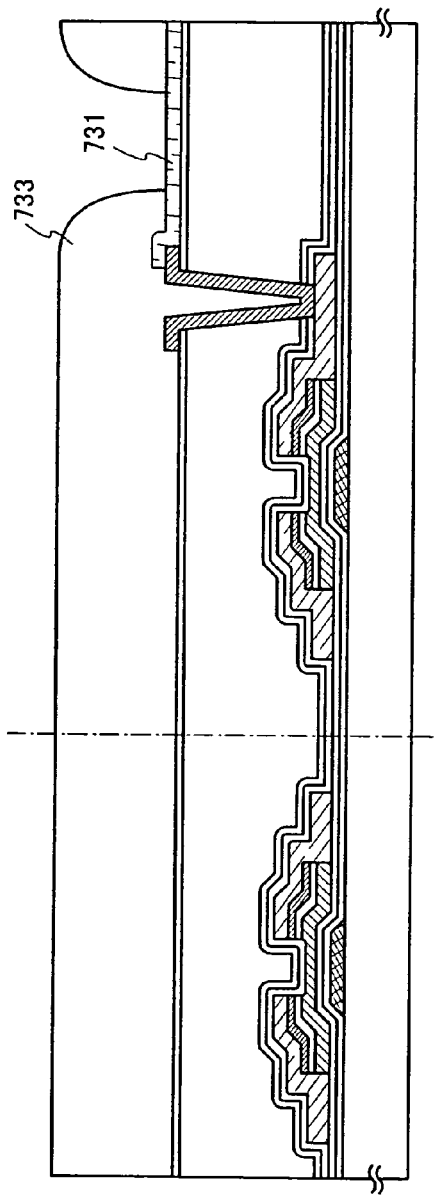
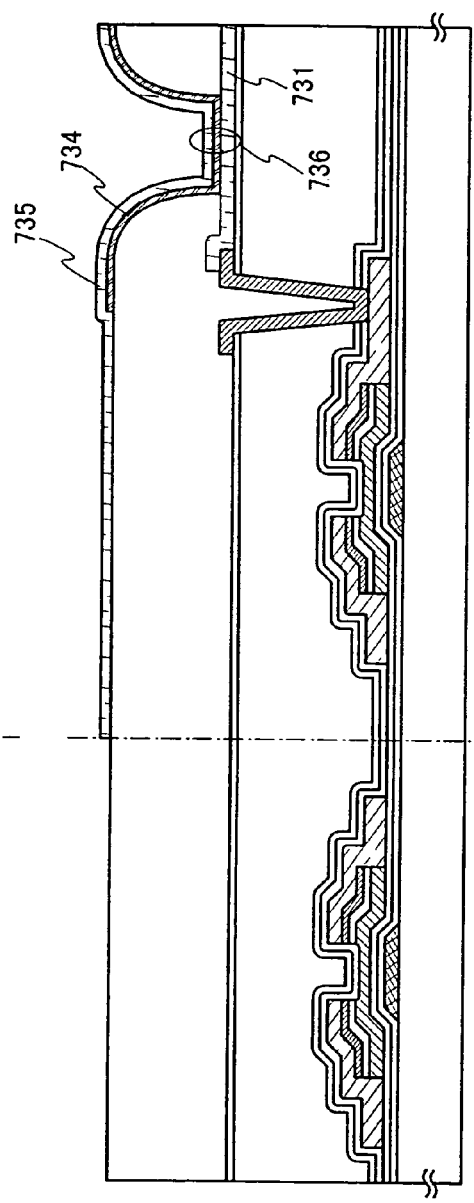

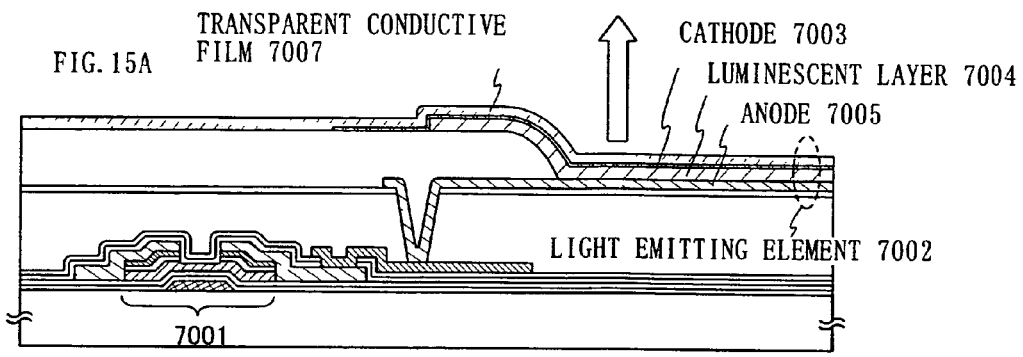
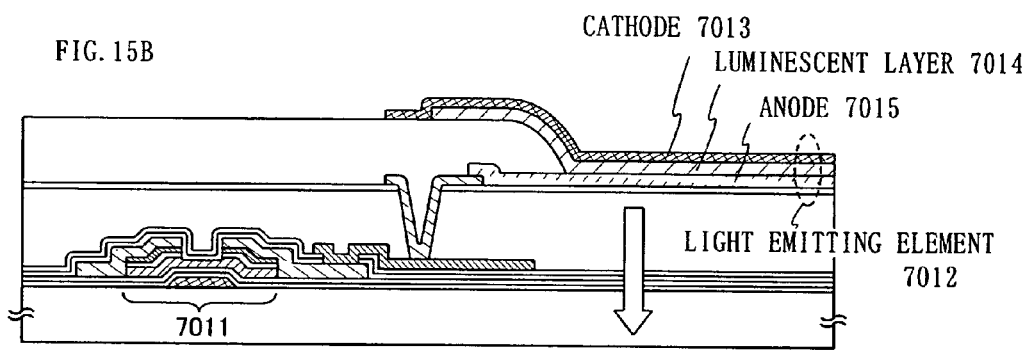
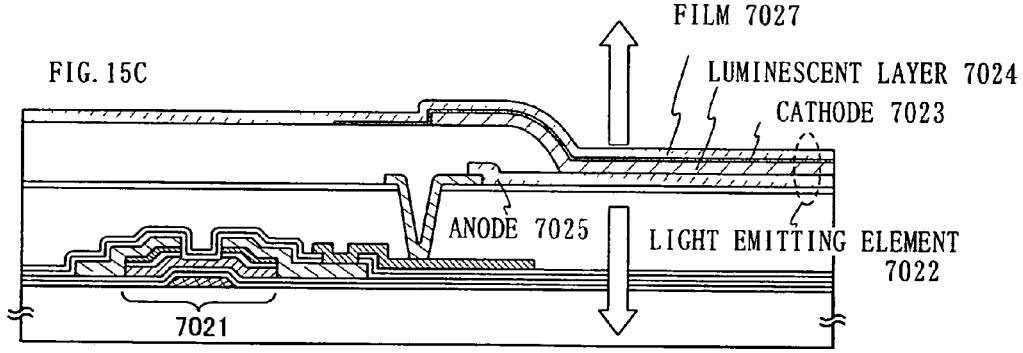

DRIVING METHOD OF LIGHT EMITTING DEVICE AND LIGHT EMITTING DEVICE

BACKGROUND OF THE INVENTION

1. Field of the Invention

The invention relates to a driving method of a light emitting device comprising a plurality of pixels each of which includes a light emitting element and a means for supplying a current to the light emitting element. The invention further relates to a light emitting device.

2. Description of the Related Art

Emitting light by itself, a light emitting element has a high visibility. Further, since it requires no backlight, a display device using the light emitting element can be easily reduced in thickness and the viewing angle thereof is not restricted. Therefore, the light emitting device using a light emitting element, which attracts attention as an alternative display device to a CRT or an LCD, has been developed for practical use. The light emitting device can be classified into a passive matrix device and an active matrix device. In the active matrix device, a current supply to a light emitting element can be maintained to some extent after a video signal input. Thus, the active matrix device can be flexibly applied to a large panel with high definition and it is expected to become the mainstream in the future. Specifically, each manufacturer offers a different pixel configuration of the active matrix light emitting device, and adopts various technical measures. Though, in general, each pixel comprises at least a light emitting element, a transistor for controlling a video signal input to the pixel, and a transistor for supplying a current to the light emitting element.

For a transistor provided in each pixel of a light emitting device, a thin film transistor (TFT) whose active layer is formed of a thin semiconductor film is mainly employed. Among the TFTs, a TFT using an amorphous semiconductor or a semi-amorphous semiconductor (microcrystalline semiconductor) has the advantage that the cost and the yield can be improved as compared with a TFT using a polycrystalline semiconductor because of fewer manufacturing steps. In addition, such a TFT requires no crystallization step after forming a semiconductor film, therefore, it can be used for forming a large panel with relative ease.

A problem in practical use of a light emitting device is luminance decay of a light emitting element with the degradation of an electro luminescent material. A degradation level of an electro luminescent material depends on the amount of light emitting time and the amount of current flowing. Accordingly, when the gray level differs in each pixel depending on a displayed image, the degradation level of a light emitting element differs in each pixel as well, leading to variations in luminance. In order to suppress such luminance decay, in the following Patent Document 1, a transistor for controlling a current supplied to a light emitting element operates in a saturation region, and a drain current is thus kept constant when the transistor is ON regardless of the degradation of an electro luminescent layer.

Patent Document 1

Japanese Patent Laid-Open No. 2002-108285

SUMMARY OF THE INVENTION

Explained hereinafter is a problem in using in a pixel a TFT formed of an amorphous semiconductor or a semi-amorphous semiconductor and operating a transistor for supplying a current to a light emitting element in a saturation region.

A semi-amorphous semiconductor is a film including a semiconductor which has an intermediate structure between amorphous and crystalline (including single crystalline and polycrystalline) structures. The semi-amorphous semiconductor has a third state which is stable in free energy, and it is a kind of a crystalline semiconductor which has a short range order and a lattice distortion. This semiconductor has a grain size of 0.5 to 20 nm and can be dispersed in a non-single crystalline semiconductor. Further, the semiconductor is mixed with at least 1 atom % of hydrogen or halogen as the neutralizing agent for dangling bond. Such a semiconductor is called herein a semi-amorphous semiconductor (SAS) for convenience. When a noble gas element such as helium, argon, krypton, or neon is mixed into an SAS, the lattice distortion is increased and the stability is thus enhanced, leading to an excellent SAS. Such SAS semiconductor is disclosed in U.S. Pat. No. 4,409,134, for example.

In the case where a TFT formed of an amorphous semiconductor or a semi-amorphous semiconductor is actually used as a transistor (driving TFT) for supplying a current to a light emitting element, an N-type TFT is employed because it has a certain mobility. The light emitting element comprises an anode, a cathode, and an electro luminescent layer provided between the anode and the cathode. In general, the anode is connected to a source or a drain of the transistor for supplying a current to the light emitting element.

FIG. 19A shows a connection of a P-type driving TFT and a light emitting element. Note that a potential Vdd>a potential Vss is satisfied. As shown in FIG. 19A, a P-type driving TFT 10 is connected in series with a light emitting element 11. In the P-type TFT, an electrode with a higher potential serves as a source (S) whereas an electrode with a lower potential serves as a drain (D). Therefore, the Vdd is supplied to a source of the P-type driving TFT 10, a drain thereof is connected to an anode of the light emitting element 11, and the Vss is supplied to a cathode of the light emitting element 11.

When a potential is supplied to a gate (G) of the driving TFT 10 in accordance with a video signal inputted to a pixel, a potential difference (gate voltage) Vgs is generated between the gate and the source of the driving TFT 10 and a drain current thereof corresponding to the Vgs is supplied to the light emitting element 11. In the case of FIG. 19A, since a fixed potential Vdd is supplied to the source of the driving TFT 10, the gate voltage Vgs is determined only by a potential supplied to the gate thereof.

A connection of an N-type driving TFT and a light emitting element is shown in FIG. 19B. As shown in FIG. 19B, an N-type driving TFT 20 is connected in series with a light emitting element 21. As for the N-type TFT, an electrode with a lower potential serves as a source (S) whereas an electrode with a higher potential serves as a drain (D). Therefore, the Vdd is supplied to a drain of the N-type driving TFT 20, a source thereof is connected to an anode of the light emitting element 21, and the Vss is supplied to a cathode of the light emitting element 21.

When a potential is supplied to a gate (G) of the driving TFT 20 in accordance with a video signal inputted to a pixel, a potential difference (gate voltage) Vgs is generated between the gate and the source of the driving TFT 20 and a drain current thereof corresponding to the Vgs is supplied to the light emitting element 21. In the case of the connection shown in FIG. 19B, however, differently from the connection shown in FIG. 19A, a potential supplied to the source of the driving TFT 20 is not fixed and determined by a source-drain voltage (drain voltage) Vds of the driving TFT 20 and an anode-cathode voltage Vel of the light emitting element 21. Accordingly, the gate voltage Vgs cannot be determined only by a potential supplied to the gate, and a drain current of the driving TFT 20 cannot be kept constant even when inputting to a pixel a video signal having the same image data, leading to variations in luminance of the light emitting element 21.

In particular, the drain voltage Vds of the driving TFT 20 which operates in a saturation region is higher than that of the driving TFT 20 which operates in a linear region. Therefore, it becomes difficult to fix a source potential when a potential is supplied to the gate of the driving TFT 20 depending on a video signal, and thus a pixel cannot display an image with a desired gray scale level.

It is to be noted that the aforementioned problem may occur when using a P-type driving TFT as well as an N-type driving TFT. In the case of a pixel where a drain of a P-type driving TFT is connected to a cathode of a light emitting element, it is difficult to fix a source potential when a potential is supplied to a gate of the P-type driving TFT in accordance with a video signal. Thus, the pixel cannot display a desired gray scale level.

In view of the foregoing, the invention provides a driving method of a light emitting device, in which a driving TFT operates in a saturation region and an image can be displayed with a desired gray scale level depending on a video signal when an N-type driving TFT is connected to an anode of a light emitting element or a P-type driving TFT is connected to a cathode of the light emitting element. The invention further provides a light emitting device using the driving method.

The general idea of the inventor is that a gate voltage of a driving TFT will be able to be written without fail depending on a video signal having image data by utilizing nonlinearity of a light emitting element. According to the invention, when a potential having image data is supplied to a gate of a driving TFT depending on a video signal, a reverse bias voltage is applied to the driving TFT and a light emitting element which are connected in series with each other. Meanwhile, a forward bias voltage is applied to the driving TFT and the light emitting element when a pixel displays an image in accordance with the video signal.

A driving method of the invention is described in more detail with reference to FIGS. 1A and 1B. FIG. 1A shows a connection of an N-type driving TFT and a light emitting element and a relation between potentials supplied to each element during a period in which a video signal is inputted to a pixel (writing period). In the writing period, a reverse bias voltage is applied to a driving TFT 100 and a light emitting element 101 which are connected in series with each other. Specifically, a potential Vss is supplied to a source of the driving TFT 100, a drain thereof is connected to an anode of the light emitting element 101, and a potential Vdd higher than the Vss is supplied to a cathode of the light emitting element 101.

It is to be noted that a TFT comprises three electrodes: a gate, a source and a drain. One of the two electrodes (first electrode and second electrode) other than the gate corresponds to either the source or the drain depending on a supplied potential level. In the case of an N-type TFT, an electrode with a lower potential corresponds to the source whereas an electrode with a higher potential corresponds to the drain. In this specification, an electrode which is closer to an anode of a light emitting element is referred to as a first electrode.

Since the light emitting element 101 is a nonlinear element, an anode-cathode voltage Vel thereof is much higher relative to a drain voltage Vds of the driving TFT 100. Accordingly, a potential at a connection node (node A) of the driving TFT 100 and the light emitting element 101 is approximately equal to the Vss. That is, a potential at the node A is considered to be substantially fixed. Note that the node A in the writing period corresponds to a connection point of the anode of the light emitting element 101 and the drain of the driving TFT 100.

When a potential Vg is supplied to the gate of the driving TFT 100 depending on a video signal at this time, a potential difference between the Vss and the Vg is held in a capacitor 102.

FIG. 1B shows a connection of the N-type driving TFT and the light emitting element and a relation between potentials supplied to each element during a period in which a pixel displays an image (display period). In the display period, a forward bias voltage is applied to the driving TFT 100 and the light emitting element 101 which are connected in series with each other. Specifically, the Vdd is supplied to the drain of the driving TFT 100, the source thereof is connected to the anode of the light emitting element 101, and the Vss is supplied to the cathode of the light emitting element 101.

At this time, the node A corresponds to a connection point of the source of the driving TFT 100 and the anode of the light emitting element 101. Accordingly, a potential difference between the Vss and the Vg, which is held in the capacitor 102 corresponds to a gate voltage Vgs of the driving TFT 100, and a drain current corresponding to the gate voltage Vgs is supplied to the light emitting element 101. Thus, according to the invention, the gate voltage Vgs of the driving TFT 100 is determined only by the Vg supplied to the gate thereof because the Vss is fixed.

Note that in the invention, the driving TFT is not limited to an N-type TFT, and a P-type TFT may be employed as well, as shown in FIG. 1C. Though, in the case of using a P-type driving TFT, the driving TFT is connected to a cathode of a light emitting element.

According to the invention, a semi-amorphous semiconductor has only to be used for a channel forming region. In addition, not all the channel forming region necessarily includes the semi-amorphous semiconductor along the thickness thereof, and the semi-amorphous semiconductor has only to be included in a part of the channel forming region.

In this specification, a light emitting element includes an element whose luminance is controlled by current or voltage. More specifically, it includes an OLED (Organic Light Emitting Diode), an MIM electron source element (electron emissive element) used for an FED (Field Emission Display), and the like.

A light emitting device includes a panel having a light emitting element sealed therein, and a module having an IC and the like including a controller which are mounted on the panel. In addition, the invention relates to an element substrate which corresponds to one mode before completing the light emitting element in manufacturing steps of the light emitting device, and the element substrate comprises a plurality of pixels each having a means for supplying a current to the light emitting element. The element substrate specifically corresponds to any aspect such as the one including only a pixel electrode of the light emitting element and the one after forming a conductive layer serving as a pixel electrode and before patterning it to form the pixel electrode.

An OLED (Organic Light Emitting Diode), which is one of the light emitting elements, comprises an anode layer, a cathode layer, and a layer including an electro luminescent material (hereinafter referred to as an electro luminescent layer) which generates the electro luminescence when an electric field is applied. The electro luminescent layer is provided between the anode and the cathode and formed of one or more layers. Specifically, the electro luminescent layer includes a hole injection layer, a hole transporting layer, a light emitting layer, an electron injection layer, an electron transporting layer, and the like. An inorganic compound may be included in the electro luminescent layer. The luminescence in the electro luminescent layer includes luminescence that is generated when an excited singlet state returns to a ground state (fluorescence) and luminescence that is generated when an excited triplet state returns to a ground state (phosphorescence).

According to the aforementioned configuration of the invention, an N-type driving TFT can operate in a saturation region and an image can be displayed with a desired gray scale level in accordance with a video signal. Further, since the driving TFT operates in a saturation region, a drain current does not vary depending on a drain voltage Vds and is determined only by a gate voltage Vgs. Therefore, the drain current can be maintained relatively constant even when the Vds is lowered without increasing the Vel in accordance with the degradation of a light emitting element. Thus, it is possible to suppress luminance decay and variations in luminance of the light emitting element due to the degradation of an electro luminescent material.

BRIEF DESCRIPTION OF THE DRAWINGS

FIGS. 1A and 1B are diagrams each showing a connection of a driving TFT and a light emitting element and a relation between potentials supplied to each element.

FIGS. 3A and 3B are diagrams each showing a driving method of the light emitting device of the invention.

FIG. 4 is a circuit diagram of a pixel portion.

FIGS. 9A and 9B are cross sectional views of a driving circuit and a pixel portion.

FIGS. 11A to 11C are diagrams each showing a manufacturing method of the light emitting device.

FIGS. 13A and 13B are diagrams each showing a manufacturing method of the light emitting device.

FIGS. 15A to 15C are cross sectional views of a pixel.

DETAILED DESCRIPTION OF THE INVENTION

Embodiment Mode

Figure 2:
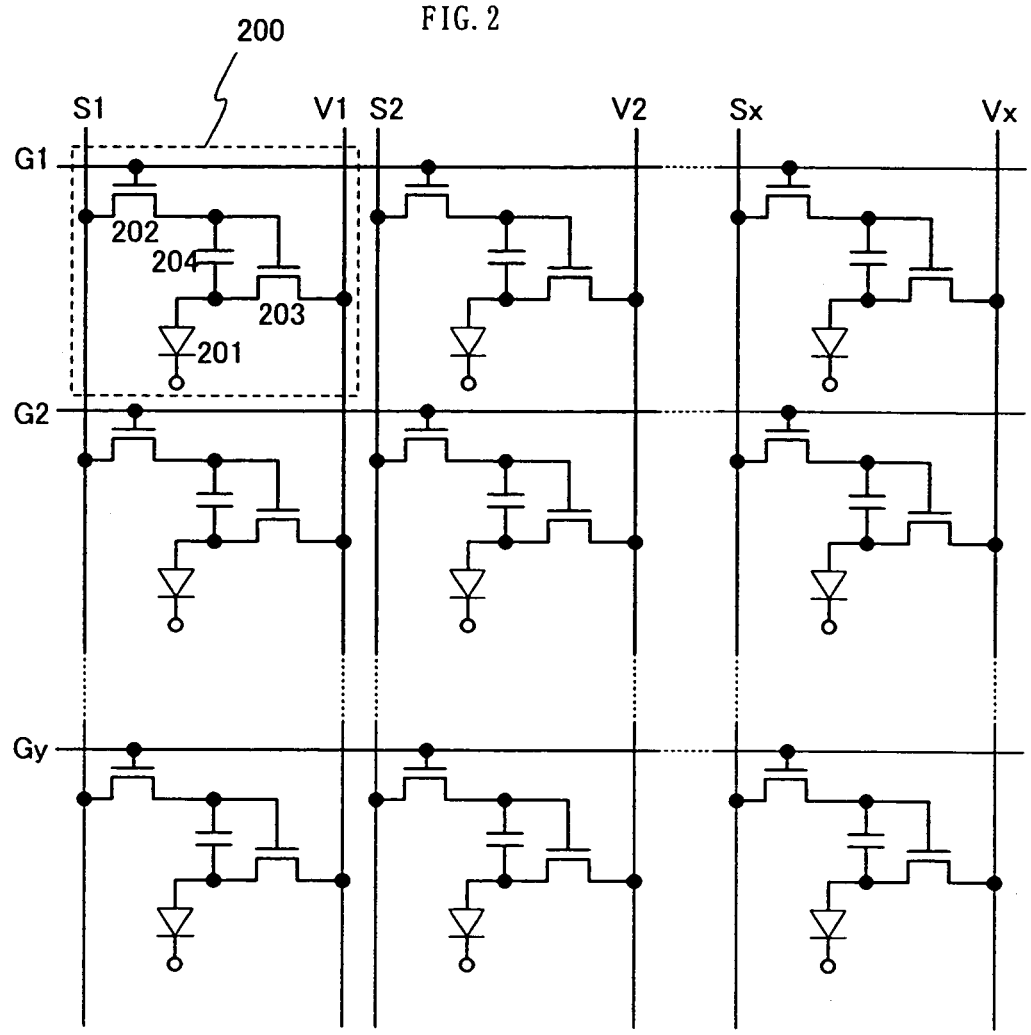
FIG. 2 is a circuit diagram of a pixel portion.

FIG. 2 shows a configuration of a pixel portion of a light emitting device which displays an image by using the driving method of the invention. As shown in FIG. 2, a plurality of pixels 200 are arranged in matrix in the pixel portion, and various signals and potentials are supplied to each of the pixels 200 via signal lines S1 to Sx, scan lines G1 to Gy and power supply lines V1 to Vx.

Each of the pixels 200 comprises a light emitting element 201, a TFT (a switching TFT) 202 for controlling a video signal input to the pixel 200, a driving TFT 203 for controlling a current supply to the light emitting element 201. Although the pixel 200 shown in FIG. 2 further comprises a capacitor 204 separately from the driving TFT 203, the invention is not limited to this configuration. The capacitor 204 is not necessarily formed separately from the driving TFT 203, and a capacitance (gate capacitance) between a gate electrode and an active layer of the driving TFT 203 may be employed as the capacitor 204 instead. An N-type TFT is used for both the switching TFT 202 and the driving TFT 203.

A gate of the switching TFT 202 is connected to a scan line Gj (j=1 to y). Either a source or a drain of the switching TFT 202 is connected to a signal line Si (i=1 to x) and the other thereof is connected to a gate of the driving TFT 203. Either a source or a drain of the driving TFT 203 is connected to a power supply line Vi (i=1 to x) and the other thereof is connected to an anode of the light emitting element 201. One of two electrodes of the capacitor 204 is connected to the gate of the driving TFT 203 and the other is connected to the anode of the light emitting element 201.

It is to be noted that the pixel configuration shown in FIG. 2 is just an example of the light emitting device to which the driving method of the invention can be applied, and the light emitting device capable of adopting the driving method of the invention is not limited to the configuration shown in FIG. 2.

A driving method of the pixel portion shown in FIG. 2 is described next. The driving method of the invention can be divided into a writing period, a reverse bias period and a display period. FIG. 3A shows an example of timing of a writing period Ta, a reverse bias period Tr and a display period Td.

First, when the reverse bias period Tr starts, a reverse bias voltage is applied to the driving TFT 203 and the light emitting element 201 which are connected in series with each other. Specifically, a potential Vss is supplied to the power supply lines V1 to Vx and a potential Vdd higher than the Vss is supplied to a cathode of the light emitting element 201.

Then, the writing period Ta starts. Note that according to the driving method of the invention, the writing period Ta is included in the reverse bias period Tr. When the writing period Ta starts, the scan lines G1 to Gy are sequentially selected, and the switching TFT 202 of each pixel 200 is turned ON. Then, as a video signal is supplied to the signal lines S1 to Sx, a video signal potential Vg is supplied to the gate of the driving TFT 203 via the switching TFT 202.

Since the light emitting element 201 is a nonlinear element, a voltage Vel between the anode and the cathode of the light emitting element 201 becomes much higher than a drain voltage Vds of the driving TFT 203 when the reverse bias voltage is applied. Accordingly, a potential of the anode of the light emitting element 201 is approximately equal to the Vss supplied to the power supply lines V1 to Vx, and a potential difference between the Vss and the video signal potential Vg is accumulated and held in the capacitor 204.

When the writing period Ta is completed and the switching TFT 202 is turned OFF, the reverse bias period Tr is completed and then, the display period Td starts.

In the display period Td, a forward bias voltage is applied to the driving TFT 203 and the light emitting element 201 which are connected in series with each other. Specifically, a potential Vdd' higher than the Vdd is supplied to the power supply lines V1 to Vx, and the Vdd is supplied to the cathode of the light emitting element 201.

Although the same potential is supplied to the cathode in both the reverse bias period Tr and the display period Td in this embodiment mode, the invention is not limited to this. It is only necessary that a reverse bias voltage is applied to the light emitting element 201 in the reverse bias period Tr and a forward bias voltage is applied to the light emitting element 201 in the display period Td, when the driving TFT 203 is ON.

When a forward bias voltage is applied, the source of the driving TFT 203 is connected to the anode of the light emitting element 201 since the driving TFT 203 is an N-type transistor. Therefore, the potential difference between the Vss and the video signal potential Vg, which is held in the capacitor 204 becomes equal to the gate voltage Vgs of the driving TFT 203. As a result, the driving TFT 203 supplies to the light emitting element 201 a drain current corresponding to the gate voltage Vgs.

FIG. 3B shows a timing chart of the scan lines G1 to Gy and the power supply lines V1 to Vx in each period. When it is supposed that pixels of one row have a scan line in common, the writing period Ta appears in sequence in each row. Each writing period Ta is included in the reverse bias period Tr. It is to be noted that the writing period Ta and the reverse bias period Tr can be overlapped with each other completely. However, by setting the reverse bias period Tr longer than the writing period Ta, it is possible to prevent noise and the like due to fluctuation of the potential of the power supply lines V1 to Vx.

Note that in the invention, the driving TFT 203 is not limited to an N-type transistor and a P-type transistor may also be employed. In the case of a P-type driving TFT, the driving TFT is connected to the cathode of the light emitting element.

Figure 7A:
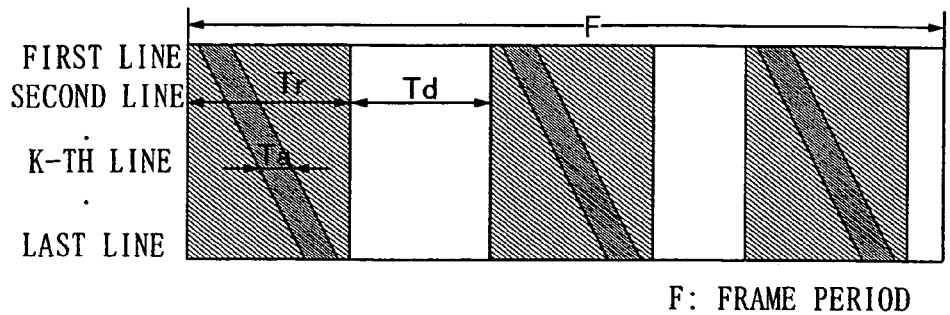
FIGS. 7A to 7C are diagrams each showing a driving method of the light emitting device of the invention.

In FIG. 3A, an example of timing of the writing period, the reverse bias period and the display period is shown in the case of using an analog video signal, however, a digital video signal may be used in the invention as well. For example, in the case where time gray scale display is achieved by the use of a digital video signal, the writing period Ta, the reverse bias period Tr and the display period Td may be provided for each bit of the digital signal as shown in FIG. 7A.

Although an amorphous semiconductor or a semi-amorphous semiconductor is used for TFTs in a pixel portion in this embodiment mode, the invention is not limited to this. The driving method of the invention can also be applied to a light emitting device using a polycrystalline semiconductor for TFTs in a pixel portion.

Embodiment 1

Described in this embodiment is an example of the light emitting device, in which the power supply lines are arranged parallel to the scan lines in the pixel portion shown in FIG. 2 and one scan line driver circuit controls both the scan lines and the power supply lines.

FIG. 4 shows a configuration of a pixel portion 401 in a light emitting device according to this embodiment. In FIG. 4, a pixel 400 comprises a light emitting element 405, a switching TFT 402, a driving TFT 403, and a capacitor 404 as the pixel portion shown in FIG. 2. The connection of each element is the same as that of the pixel 200 shown in FIG. 2. However, the power supply lines V1 to Vy are arranged parallel to the scan lines G1 to Gy in this embodiment.

Figure 20A:
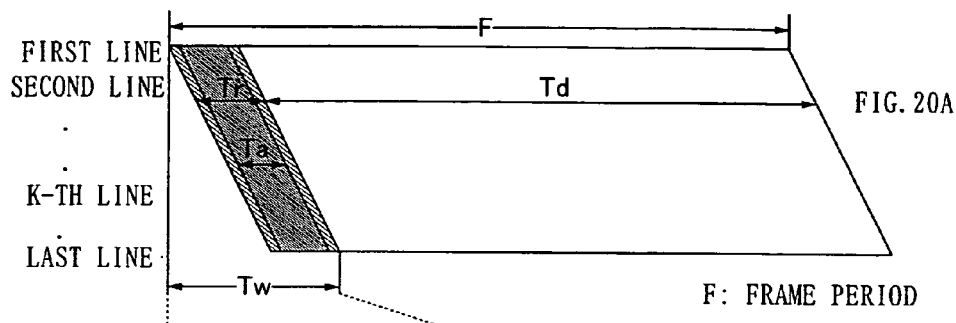
FIGS. 20A and 20B are diagrams each showing a driving method of the light emitting device of the invention.

A driving method of the pixel portion shown in FIG. 4 is described next. The driving method of the invention can be divided into a writing period Ta, a reverse bias period Tr and a display period Td. FIG. 20A shows an example of timing of the writing period Ta, the reverse bias period Tr and the display period Td. The total period from the beginning until the end of the reverse bias period Tr in all pixels is denoted by a Tw.

First, when the reverse bias period Tr starts, a potential Vdd higher than a potential Vss is supplied to a cathode of the light emitting element 405, and the Vss is supplied to the power supply lines V1 to Vy in sequence. Accordingly, a reverse bias voltage is sequentially applied to the driving TFT 403 and the light emitting element 405, which are connected in series with each other, for pixels in each row.

Then, the writing period Ta starts. Note that in the driving method of the invention, the writing period Ta is included in the reverse bias period Tr for each row. When the writing period Ta starts, the scan lines G1 to Gy are sequentially selected, and the switching TFT 402 in each pixel is turned ON. Then, when a video signal is supplied to the signal lines S1 to Sx, a video signal potential Vg is supplied to a gate of the driving TFT 403 via the switching TFT 402.

Since the light emitting element 405 is a nonlinear element, an anode-cathode voltage Vel of the light emitting element 405 becomes much higher than a drain voltage Vds of the driving TFT 403 when the reverse bias voltage is applied. Accordingly, a potential of the anode of the light emitting element 405 is approximately equal to the Vss supplied to the power supply lines V1 to Vy, and a potential difference between the Vss and the video signal potential Vg is accumulated and held in the capacitor 404.

When the writing period Ta is completed and the switching TFT 402 is turned OFF, the reverse bias period Tr is completed and then, the display period Td starts.

In the display period Td, a forward bias voltage is sequentially applied to the driving TFT 403 and the light emitting element 405 which are connected in series with each other. Specifically, the Vdd is supplied to the cathode of the light emitting element 405, and a potential Vdd' higher than the Vdd is supplied to the power supply lines V1 to Vy.

In the light emitting device shown in FIG. 4, the same potential is supplied to the cathode in both the reverse bias period Tr and the display period Td.

When a forward bias voltage is applied, a source of the driving TFT 403 is connected to the anode of the light emitting element 405 since the driving TFT 403 is an N-type transistor. Therefore, the potential difference between the Vss and the video signal potential Vg, which is held in the capacitor 404 becomes equal to the gate voltage Vgs of the driving TFT 403. As a result, the driving TFT 403 supplies to the light emitting element 405 a drain current corresponding to the gate voltage Vgs.

Figure 20B:
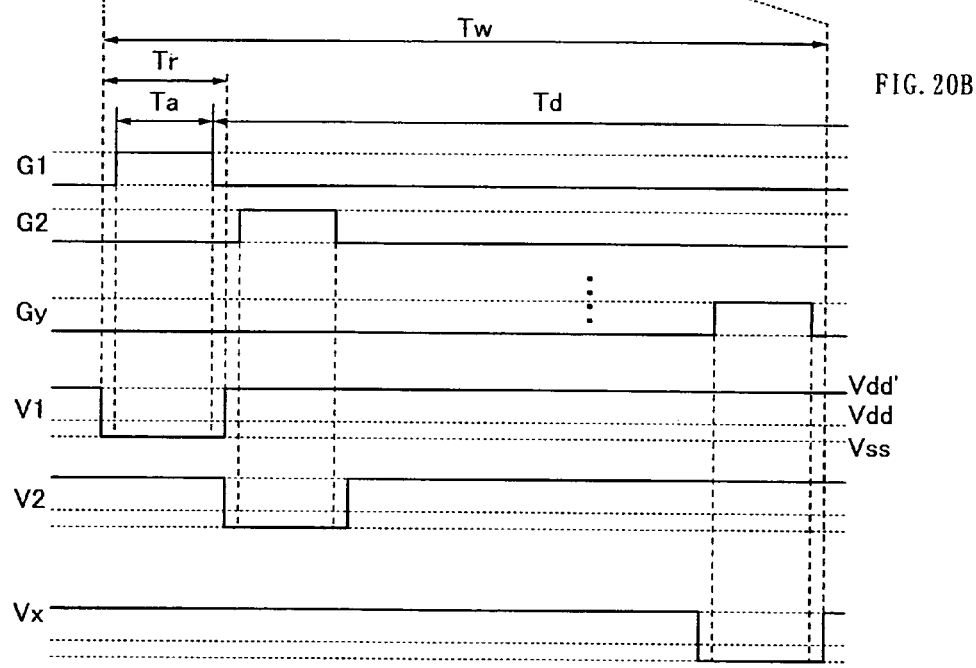

FIG. 20B shows a timing chart of the scan lines G1 to Gy and the power supply lines V1 to Vy in each period. When it is supposed that pixels of one row have a scan line in common, the writing period Ta appears in sequence in each row. Each writing period Ta is included in the corresponding reverse bias period Tr. It is to be noted that the writing period Ta and the reverse bias period Tr can be overlapped with each other completely. However, by setting the reverse bias period Tr longer than the writing period Ta, it is possible to prevent noise and the like due to fluctuation of the potential of the power supply lines V1 to Vy.

Differently from the pixel shown in FIG. 2, timing of the reverse bias period Tr can be set for each row in the pixel shown in FIG. 4. Therefore, the proportion that the display period Td occupies per one frame period can be increased, and thus, the operating frequency of the driver circuit can be suppressed.

Figure 7B:
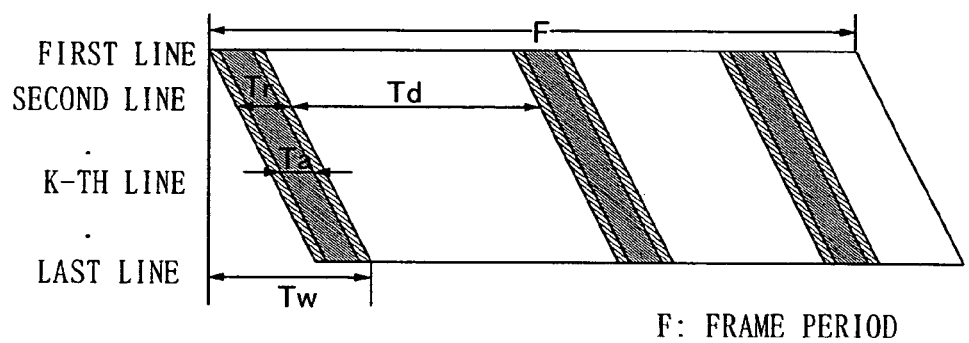

In FIG. 20A, an example of timing of the writing period, the reverse bias period and the display period is shown in the case of using an analog video signal, however, a digital video signal may be used in the invention as well. For example, in the case where time gray scale display is achieved by the use of a digital video signal, the writing period Ta, the reverse bias period Tr and the display period Td may be provided for each bit of the digital signal as shown in FIG. 7B.

Figure 5A:
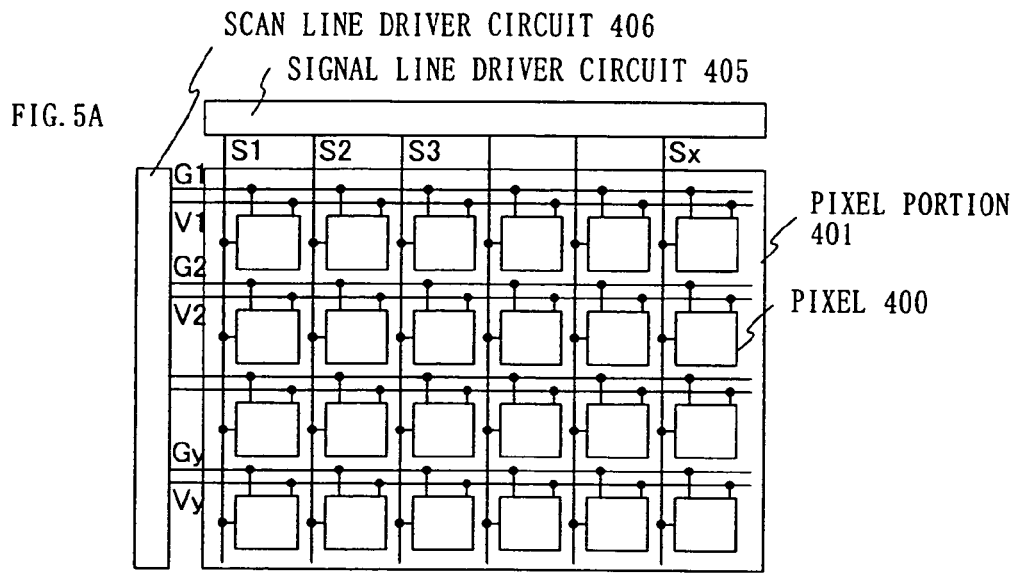
FIGS. 5A to 5C are diagrams each showing a configuration of the light emitting device of the invention.

FIG. 5A shows a configuration of a light emitting device which comprises the pixel portion 401 shown in FIG. 4 and driver circuits. In FIG. 5A, reference numeral 405 denotes a signal line driver circuit for supplying a video signal to the signal lines S1 to Sx, and 406 denotes a scan line driver circuit for controlling potentials of the scan lines G1 to Gy and the power supply lines V1 to Vy.

Figure 5B:
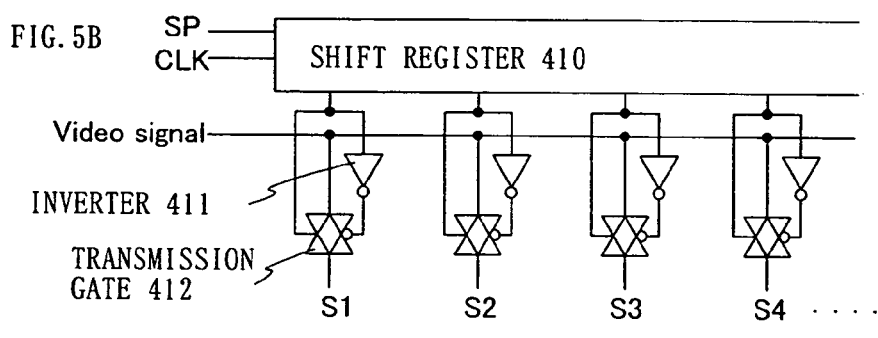

FIG. 5B shows a part of the signal line driver circuit 405. The signal line driver circuit 405 comprises a shift register 410, an inverter 411 for inverting a signal outputted from the shift register 410, and a transmission gate which samples a video signal in synchronism with the signal outputted from the shift register 410 and the inverted signal outputted from the inverter 411 and supplies the video signal to the signal lines S1 to Sx.

Figure 5C:
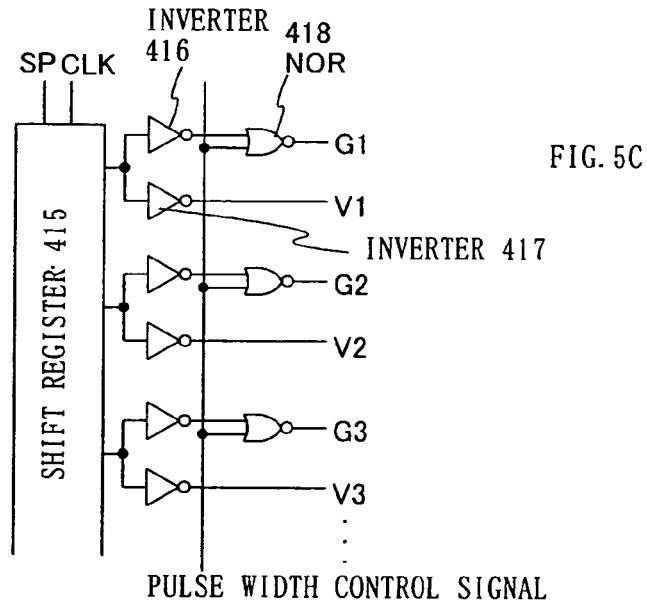

FIG. 5C shows a part of the scan line driver circuit 406. The scan line driver circuit 406 comprises a shift register 415, inverters 416 and 417 for inverting a signal outputted from the shift register 415, and a NOR circuit which controls a pulse width of an inverted signal outputted from the inverter 416 depending on a pulse width control signal and supplies the inverted signal to the scan lines G1 to Gy. A signal outputted from the inverter 417 is supplied to the power supply lines V1 to Vy.

According to the aforementioned configuration, the scan lines G1 to Gy and the power supply lines V1 to Vy can be controlled by a single scan line driver circuit 406

Embodiment 2

Described in this embodiment is a pixel configuration of a light emitting device capable of adopting the driving method of the invention.

Figure 6A:
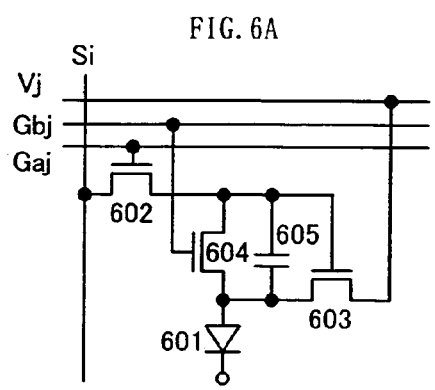
FIGS. 6A to 6E are circuit diagrams of a pixel.

A pixel shown in FIG. 6A comprises a light emitting element 601, a switching TFT 602, a driving TFT 603, an erasing TFT 604 for forcibly stopping light emission of the light emitting element 601, and a capacitor 605. A gate of the switching TFT 602 is connected to a first scan line Gaj (j=1 to y), either a source or a drain thereof is connected to a signal line Si (i=1 to x), and the other thereof is connected to a gate of the driving TFT 603. Either a source or a drain of the driving TFT 603 is connected to a power supply line Vj (j=1 to y) and the other thereof is connected to an anode of a light emitting element 601. A gate of the erasing TFT 604 is connected to a second scan line Gbj (j=1 to y), either a source or a drain thereof is connected to the gate of the driving TFT 603, and the other thereof is connected to the anode of the light emitting element 601. One of two electrodes of the capacitor 605 is connected to the anode of the light emitting element 601 and the other thereof is connected to the gate of the driving TFT 603.

The erasing TFT 604 is OFF in a writing period Ta. Then, the erasing TFT 604 is turned ON when a forward bias voltage is applied to the driving TFT 603 and the light emitting element 601 which are connected in series with each other. As a result, a gate voltage Vgs of the driving TFT 603 can be made equal to 0, the driving TFT 603 is turned OFF, and light emission of the light emitting element 601 is forcibly stopped. Thus, a display period is completed.

Figure 6B:
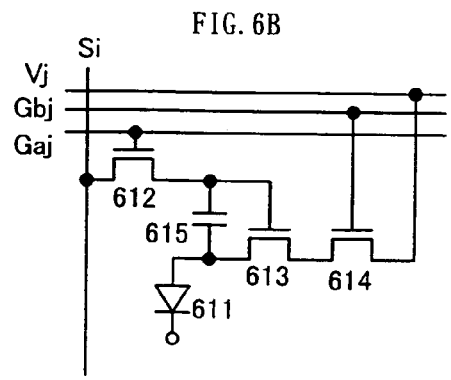

A pixel shown in FIG. 6B comprises a light emitting element 611, a switching TFT 612, a driving TFT 613, an erasing TFT 614 for forcibly stopping light emission of the light emitting element 611, and a capacitor 615. A gate of the switching TFT 612 is connected to the first scan line Gaj (j=1 to y), either a source or a drain thereof is connected to the signal line Si (i=1 to x), and the other thereof is connected to a gate of the driving TFT 613. The driving TFT 613 and the erasing TFT 614 are connected in series with each other between the power supply line Vj (j=1 to y) and the light emitting element 611. Specifically, either a source or a drain of the driving TFT 613 is connected to an anode of the light emitting element 611, and either a source or a drain of the erasing TFT 614 is connected to the power supply line Vj. A gate of the erasing TFT 614 is connected to the second scan line Gbj (j=1 to y). One of two electrodes of the capacitor 615 is connected to the anode of the light emitting element 611 and the other thereof is connected to the gate of the driving TFT 613.

It is to be noted that although the erasing TFT 614 is provided between the driving TFT 613 and the power supply line Vj in FIG. 6B, the invention is not limited to this arrangement of the erasing TFT 614. For example, the erasing TFT 614 may be provided between the light emitting element 611 and the driving TFT 613. In that case, specifically, either the source or the drain of the driving TFT 613 is connected to the power supply line Vj, and either the source or the drain of the erasing TFT 614 is connected to the anode of the light emitting element 611. Then, one of the two electrodes of the capacitor 615 is connected to the gate of the driving TFT 613, and the other thereof is connected to either the source or the drain of the driving TFT 613, which is not connected to the power supply line Vj.

The erasing TFT 614 is ON in a reverse bias period Tr and a display period Td. Then, the erasing TFT 614 is turned OFF when a forward bias voltage is applied to the driving TFT 613, the erasing TFT 614 and the light emitting element 611, which are connected in series with each other. As a result, light emission of the light emitting element 611 is forcibly stopped and the display period Td can be completed.

Figure 7C:
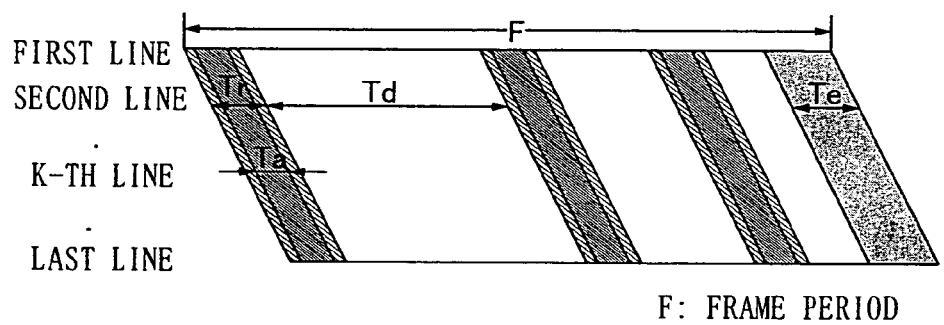

FIG. 7C shows timing of the writing period Ta, the reverse bias period Tr, the display period Td, and an erasing period Te which appears by forcibly stopping light emission of the light emitting element, in the case where time gray scale display is achieved in the pixels shown in FIGS. 6A and 6B by the use of a digital video signal. As shown in FIG. 7C, the erasing period Te allows the display period Tr to be forcibly completed from the first row in which the writing period Ta is completed, before completing the writing period Ta in all the rows. Accordingly, gray scale levels can be increased without reducing the writing period, leading to suppressed operating frequency of the driver circuit.

Note that in the case of the pixel shown in FIG. 6A, the erasing TFT 604 may be ON all the time in the erasing period Te, or it may be turned ON at the beginning of the erasing period Te and may be OFF in the rest of the period. On the other hand, in the case of the pixel shown in FIG. 6B, the erasing TFT 604 is ON all the time in the erasing period Te.

Figure 6C:
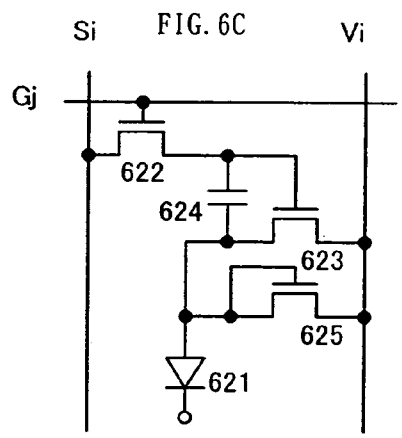

FIG. 6C shows a pixel configuration in which a diode connected TFT is added between an anode of a light emitting element and a power supply line in the pixel shown in FIG. 2. A pixel shown in FIG. 6C comprises a light emitting element 621, a switching TFT 622, a driving TFT 623, a capacitor 624, and a rectifying TFT 625. A gate of the switching TFT 622 is connected to the scan line Gj (j=1 to y), either a source or a drain thereof is connected to the signal line Si (i=1 to x), and the other thereof is connected to a gate of the driving TFT 623. Either a source or a drain of the driving TFT 623 is connected to the power supply line Vi (i=1 to x) and the other thereof is connected to an anode of the light emitting element 621. A gate of the rectifying TFT 625 is connected to the anode of the light emitting element 621, either a source or a drain thereof is connected to the power supply line Vi, and the other is connected to the anode of the light emitting element 621.

In a reverse bias period, the source of the rectifying TFT 625 is connected to the power supply line Vi, and the gate and the drain thereof are connected to each other. Accordingly, the rectifying TFT 625 is turned ON and a forward bias current is supplied, thus, a potential of the anode of the light emitting element 621 becomes closer to that of the power supply line Vi. Meanwhile, in a display period, the drain of the rectifying TFT 625 is connected to the power supply line Vi, and the gate and the source thereof are connected to each other. Therefore, a reverse bias voltage is applied to the rectifying TFT 625, and the rectifying TFT 625 is thus turned OFF. According to such a configuration, in the pixel shown in FIG. 6C, a potential of the anode of the light emitting element 621 can be made close to that of the power supply line Vi sooner even when a drain current of the driving TFT 623 is low, in the case where an image is displayed with low level gray scale by the use of an analog video signal.

Figure 6D:
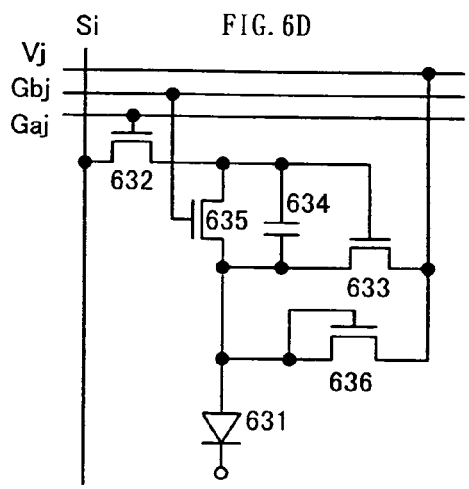

FIG. 6D shows a pixel configuration in which a diode connected TFT is added between an anode of a light emitting element and a power supply line in the pixel shown in FIG. 6A. A pixel shown in FIG. 6D comprises a light emitting element 631, a switching TFT 632, a driving TFT 633, a capacitor 634, an erasing TFT 635, and a rectifying TFT 636. A gate of the switching TFT 632 is connected to the first scan line Gaj (j=1 to y), either a source or a drain thereof is connected to the signal line Si (i=1 to x), and the other thereof is connected to a gate of the driving TFT 633. Either a source or a drain of the driving TFT 633 is connected to the power supply line Vj (j=1 to y) and the other thereof is connected to an anode of the light emitting element 631. A gate of the erasing TFT 635 is connected to the second scan line Gbj (j=1 to y), either a source or a drain thereof is connected to the gate of the driving TFT 633, and the other thereof is connected to the anode of the light emitting element 631. A gate of the rectifying TFT 636 is connected to the anode of the light emitting element 631, either a source or a drain thereof is connected to the power supply line Vj, and the other thereof is connected to the anode of the light emitting element 631.

Figure 6E:
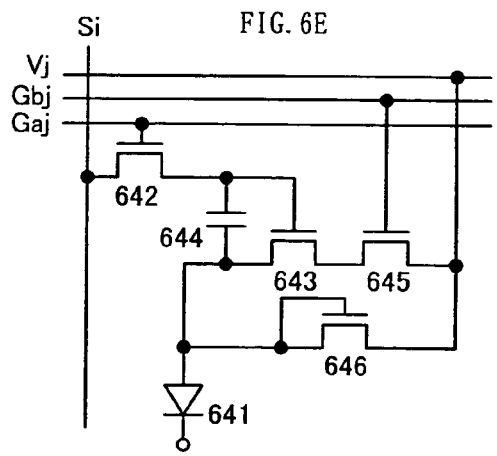

FIG. 6E shows a pixel configuration in which a diode connected TFT is added between an anode of a light emitting element and a power supply line in the pixel shown in FIG. 6B. A pixel shown in FIG. 6E comprises a light emitting element 641, a switching TFT 642, a driving TFT 643, a capacitor 644, an erasing TFT 645, and a rectifying TFT 646. A gate of the switching TFT 642 is connected to the first scan line Gaj (j=1 to y), either a source or a drain thereof is connected to the signal line Si (i=1 to x), and the other thereof is connected to a gate of the driving TFT 643. The driving TFT 643 and the erasing TFT 645 are connected in series with each other. Either a source or a drain of the driving TFT 643 is connected to the power supply line Vj, and either a source or a drain of the erasing TFT 645 is connected to an anode of the light emitting element 641. A gate of the rectifying TFT 646 is connected to the anode of the light emitting element 641, either a source or a drain thereof is connected to the power supply line Vj, and the other thereof is connected to the anode of the light emitting element 641.

Although the erasing TFT 645 is provided between the driving TFT 643 and the power supply line Vj in FIG. 6E, the invention is not limited to this arrangement of the erasing TFT 645. For example, it may be provided between the light emitting element 641 and the driving TFT 643. In this case, specifically, either the source or the drain of the driving TFT 643 is connected to the power supply line Vj, and either the source or the drain of the erasing TFT 645 is connected to the anode of the light emitting element 641. Further, one of two electrodes of the capacitor 644 is connected to the gate of the driving TFT 643, and the other thereof is connected to either the source or the drain of the driving TFT 643, which is not connected to the power supply line Vj.

The pixel configuration of the light emitting device of the invention is not limited to the ones shown in this embodiment.

Embodiment 3

In the case of using TFTs formed of a semi-amorphous semiconductor (semi-amorphous TFTs) for the light emitting device of the invention, a driver circuit can be integrally formed on the same substrate as a pixel portion. Meanwhile, in the case of using TFTs formed of an amorphous semiconductor (amorphous TFTs), a driver circuit formed on another substrate may be mounted on the same substrate as a pixel portion.

Figure 8A:
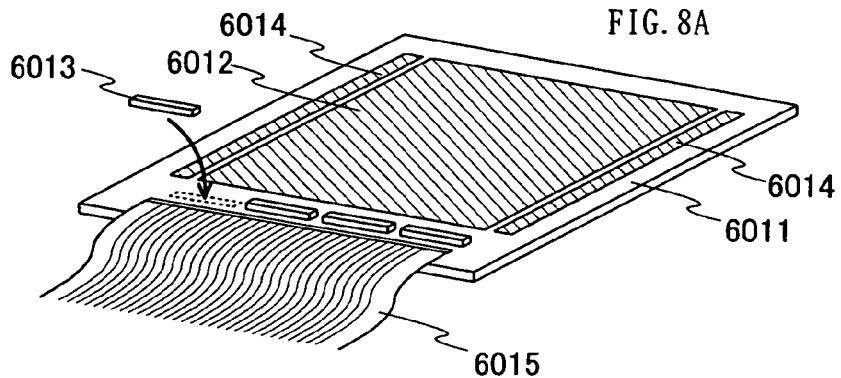
FIGS. 8A to 8D are schematic diagrams of an element substrate used for the light emitting device of the invention.

FIG. 8A shows an example of an element substrate in which a pixel portion 6012 is formed on a substrate 6011 and connected to a signal line driver circuit 6013 formed separately. The pixel portion 6012 and scan line driver circuits 6014 are formed by using semi-amorphous TFTs. The signal line driver circuit 6013 is formed of transistors which exhibit a higher mobility than the semi-amorphous TFTs. As a result, it is possible to stabilize the operation of the signal line driver circuit which is required to operate at a higher frequency than the scan line driver circuit. It is to be noted that the signal line driver circuit 6013 may be formed of transistors using a single crystalline semiconductor, TFTs using a polycrystalline semiconductor, or transistors using an SOI. Power supply potentials, various signals and the like are supplied to each of the pixel portion 6012, the signal line driver circuit 6013, and the scan line driver circuits 6014 via an FPC 6015.

Note that the signal line driver circuit and the scan line driver circuits may be integrally formed on the same substrate as the pixel portion.

Figure 8B:
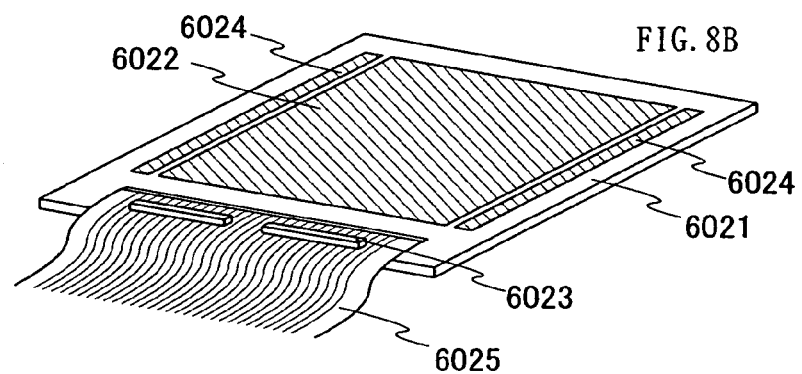

Further, in the case of forming a driver circuit separately, a substrate on which the driver circuit is formed is not necessarily attached on a substrate on which a pixel portion is formed, and may be attached on an FPC, for example. FIG. 8B shows an example of an element substrate in which a pixel portion 6022 and a scan line driver circuit 6024 are formed on a substrate 6021 and connected to a signal line driver circuit 6023 formed separately. The pixel portion 6022 and scan line driver circuits 6024 are formed by using semi-amorphous TFTS. The signal line driver circuit 6023 is connected to the pixel portion 6022 via an FPC 6025. Power supply potentials, various signals and the like are supplied to each of the pixel portion 6022, the signal line driver circuit 6023, and the scan line driver circuit 6024 via the FPC 6025.

Figure 8C:
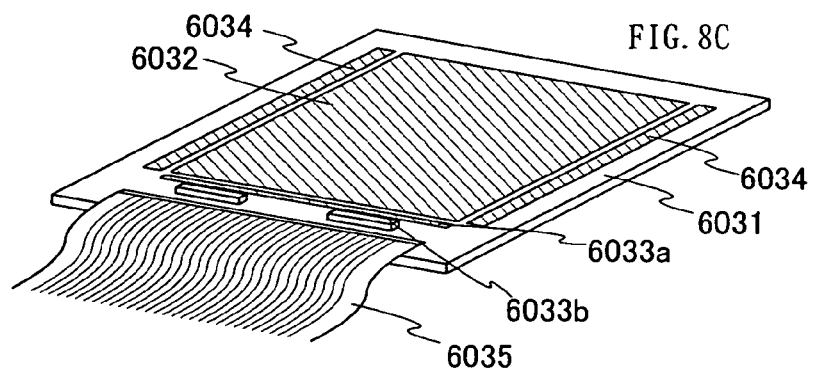

Alternatively, only a part of a signal line driver circuit or a part of a scan line driver circuit may be formed on the same substrate as a pixel portion by using semi-amorphous TFTs, and the rest thereof may be formed separately and connected to the pixel portion electrically. FIG. 8C shows an example of an element substrate in which an analog switch 6033*a* of a signal line driver circuit is formed on the same substrate 6031 as a pixel portion 6032 and scan line driver circuits 6034, and a shift register 6033b of the signal line driver circuit is formed separately on another substrate and attached on the substrate 6031. The pixel portion 6032 and the scan line driver circuits 6034 are formed of semi-amorphous TFTs. Power supply potentials and various signals and the like are supplied to each of the pixel portion 6032, the signal line driver circuit, and the scan line driver circuits 6034 via an FPC 6035.

As shown in FIGS. 8A to 8C, according to the invention, a part or the whole of a driver circuit of the light emitting device can be formed on the same substrate as a pixel portion by using semi-amorphous TFTs.

Figure 8D:
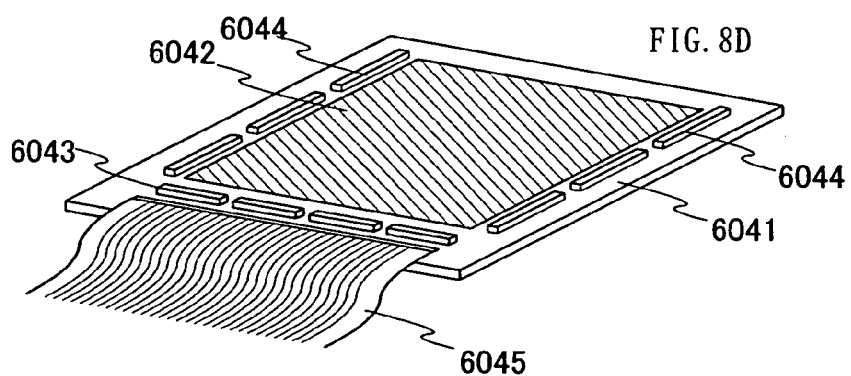

Moreover, both a signal line driver circuit and a scan line driver circuit may be formed separately and mounted on a substrate on which a pixel portion is formed. FIG. 8D shows an example of an element substrate in which a chip 6043 including a signal line driver circuit and chips 6044 each including a scan line driver circuit are attached on a substrate 6041 on which a pixel portion 6042 is formed. The pixel portion 6042 is formed of semi-amorphous TFTs or amorphous TFTs. Power supply potentials and various signals are supplied to each of the pixel portion 6042, the chip 6043 including a signal line driver circuit, and the chips 6044 each including a scan line driver circuit via an FPC 6045.

A connecting method of a separately formed substrate is not exclusively limited, and a known method such as COG, wire bonging, and TAB may be used. In addition, a connecting point is not limited to the ones shown in FIGS. 8A to 8D as far as electrical connection is possible. Further, a controller, a CPU, a memory and the like may be formed separately to be connected.

The signal line driver circuit used in the invention is not limited to the one including a shift register and an analog switch only. It may comprise other circuits such as a buffer, a level shifter, and a source follower as well as the shift register and the analog switch. The shift register and the analog switch are not necessarily provided. For example, a circuit such as a decoder for selecting a signal line can be used instead of the shift register and a latch or the like can be used instead of the analog switch.

A mounting method of a chip is not exclusively limited, and a known method such as COG, wire boding, and TAB may be employed. In addition, a mounting point is not limited to the ones shown in FIGS. 8A to 8D as far as electrical connection is possible. Although the signal line driver circuit and the scan line driver circuit are each formed in a chip in FIGS. 8A to 8D, a controller, a CPU, a memory and the like may be formed in a chip to be mounted. Further, not the whole scan line driver circuit is necessarily formed in a chip, and only a part of the scan line driver circuit may be formed in a chip.

According to this embodiment, an integrated circuit such as a driver circuit is separately formed in a chip and mounted. As a result, the yield can be improved as compared with in the case of integrally forming all the circuits on the same substrate as a pixel portion, and optimization of process can be easily achieved in accordance with characteristics of each circuit.

Embodiment 4

Described next is a structure of a TFT formed of a semi-amorphous semiconductor, which is used in the light emitting device of the invention. FIG. 9A shows a cross sectional structure of a TFT used for a driver circuit and a TFT used for a pixel portion. Reference numeral 501 corresponds to a cross sectional view of a TFT used for a driver circuit, 502 corresponds to a cross sectional view of a TFT used for a pixel portion, and 503 corresponds to a cross sectional view of a light emitting element to which the TFT 502 supplies a current. The TFTs 501 and 502 are inverted staggered (bottom gate) TFTs.

The TFT 501 of the driver circuit comprises a gate electrode 510 formed on a substrate 500, a gate insulating layer 511 formed so as to cover the gate electrode 510, and a first semiconductor layer 512 which is formed of a semi-amorphous semiconductor film and overlapped with the gate electrode 510 with the gate insulating layer 511 interposed therebetween. The TFT 501 further comprises a pair of second semiconductor layers 513 each of which functions as either a source region or a drain region, and third semiconductor layers 514 formed between the first semiconductor layer 512 and the second semiconductor layers 513.

Although the gate insulating layer 511 is formed of two insulating layers in FIG. 9A, the invention is not limited to this. The gate insulating layer 511 may be formed of a single insulating layer or three or more insulating layers.

The second semiconductor layers 513 are formed of an amorphous semiconductor film or a semi-amorphous semiconductor film, and added with an impurity which imparts one conductivity. The pair of second semiconductor layers 513 are opposed to each other with a channel forming region of the first semiconductor layer 512 interposed therebetween.

The third semiconductor layers 514 are formed of an amorphous semiconductor film or a semi-amorphous semiconductor film, and has the same conductivity as the second semiconductor layers 513 and a lower conductivity than the second semiconductor layers 513. Since the third semiconductor layers 514 function as LDD regions, they grade the electric field concentrated at ends of the second semiconductor layers 513 which function as drain regions, leading to prevention of a hot carrier effect. The third semiconductor layers 514 are not necessarily provided, however, a high voltage TFT can be achieved as well as an improved reliability by providing the third semiconductor layers 514. In the case where the TFT 501 is an N-type transistor, an N-type conductivity can be obtained when forming the third semiconductor layers 514 without adding an impurity which imparts an N-type conductivity. Therefore, in the case of using an N-type transistor for the TFT 501, an impurity which imparts an N-type conductivity is not necessarily added to the third semiconductor layers 514. However, an impurity which imparts a P-type conductivity is added to the first semiconductor layer 512 for forming a channel region, so that the conductivity is as close to I-type as possible.

Wirings 515 are formed so as to cover the pair of third semiconductor layers 514.

The TFT 502 of the pixel portion comprises a gate electrode 520 formed on the substrate 500, the gate insulating layer 511 formed so as to cover the gate electrode 520, and a first semiconductor layer 522 which is formed of a semi-amorphous semiconductor film and overlapped with the gate electrode 520 with the gate insulating layer 511 interposed therebetween. The TFT 502 further comprises a pair of second semiconductor layers 523 each of which functions as either a source region or a drain region, and third semiconductor layers 524 formed between the first semiconductor layer 522 and the second semiconductor layers 523.

The second semiconductor layers 523 are formed of an amorphous semiconductor film or a semi-amorphous semiconductor film, and an impurity which imparts one conductivity is added thereto. The pair of second semiconductor layers 523 are opposed to each other with a channel forming region of the first semiconductor layer 522 interposed therebetween.

The third semiconductor layers 524 are formed of an amorphous semiconductor film or a semi-amorphous semiconductor film, and has the same conductivity as the second semiconductor layers 523 and a lower conductivity than the second semiconductor layers 523. Since the third semiconductor layers 524 function as LDD regions, they grade the electric field concentrated at ends of the second semiconductor layers 523 which function as drain regions, leading to prevention of a hot carrier effect. The third semiconductor layers 524 are not necessarily provided, however, a high voltage TFT can be achieved as well as an improved reliability by providing the third semiconductor layers 524. In the case where the TFT 502 is an N-type transistor, an N-type conductivity can be obtained when forming the third semiconductor layers 524 without adding an impurity which imparts an N-type conductivity. Therefore, in the case of using an N-type transistor for the TFT 502, an impurity which imparts an N-type conductivity is not necessarily added to the third semiconductor layers 524. However, an impurity which imparts a P-type conductivity is added to the first semiconductor layer 522 for forming a channel region, so that the conductivity is as close to I-type as possible.

Wirings 525 are formed so as to cover the pair of third semiconductor layers 524.

A first passivation layer 540 and a second passivation layer 541 are formed of insulating films so as to cover the TFTs 501 and 502 and the wirings 515 and 525. The number of passivation layers for covering the TFTs 501 and 502 is not limited to two, and a single layer or three or more layers may be used. For example, the first passivation layer 540 may be formed of silicon nitride and the second passivation layer 541 may be formed of silicon oxide. The passivation layers formed of silicon nitride or silicon oxide can prevent the TFTs 501 and 502 from degrading due to moisture and oxygen.

Either of the wirings 525 is connected to an anode 530 of the light emitting element 503. An electro luminescent layer 531 is formed on the anode 530, and a cathode 532 is formed on the electro luminescent layer 531.

When the first semiconductor layers 512 and 522 each including a channel forming region are formed by using a semi-amorphous semiconductor, a TFT which exhibits a higher mobility than a TFT using an amorphous semiconductor can be achieved. As a result, the driver circuit and the pixel portion can be integrally formed on the same substrate.

Described next is a structure of a TFT included in the light emitting device of the invention, which is different from the one shown in FIG. 9A. FIG. 9B shows a cross sectional structure of a TFT used for a driver circuit and a TFT used for a pixel portion. Reference numeral 301 corresponds to a cross sectional view of a TFT used for a driver circuit, 302 corresponds to a cross sectional view of a TFT used for a pixel portion, and 303 corresponds to a cross sectional view of a light emitting element 303 to which the TFT 302 supplies a current.

The TFT 301 of the driver circuit and the TFT 302 of the pixel portion comprise gate electrodes 310 and 320 formed on a substrate 300, a gate insulating layer 311 formed so as to cover the gate electrodes 310 and 320, and first semiconductor layers 312 and 322 which are formed of a semi-amorphous semiconductor film and overlapped with the gate electrodes 310 and 320 with the gate insulating layer 311 interposed therebetween, respectively. Channel protective layers 330 and 331 formed of insulating films are formed so as to cover channel forming regions of the first semiconductor layers 312 and 322, respectively. The channel protective layers 330 and 331 are provided in order to prevent the channel forming regions of the first semiconductor layers 312 and 322 from being etched during manufacturing steps of the TFTs 301 and 302, respectively. The TFTs 301 and 302 further comprise pairs of second semiconductor layers 313 and 323 each of which functions as either a source region or a drain region, and third semiconductor layers 314 and 324 formed between the first semiconductor layers 312 and 322 and the second semiconductor layers 313 and 323, respectively.

Although the gate insulating layer 311 is formed of two insulating layers in FIG. 9B, the invention is not limited to this. The gate insulating layer 311 may be formed of a single insulating layer or three or more insulating layers.

The second semiconductor layers 313 and 323 are formed of an amorphous semiconductor film or a semi-amorphous semiconductor film, and an impurity which imparts one conductivity is added thereto. The pairs of second semiconductor layers 313 and 323 are opposed to each other with channel forming regions of the first semiconductor layers 312 and 322 interposed therebetween.

The third semiconductor layers 314 and 324 are formed of an amorphous semiconductor film or a semi-amorphous semiconductor film, and have the same conductivity as the second semiconductor layers 313 and 323 and a lower conductivity than the second semiconductor layers 313 and 323. Since the third semiconductor layers 314 and 324 function as LDD regions, they grade the electric field concentrated at ends of the second semiconductor layers 313 and 323 which function as drain regions, leading to prevention of a hot carrier effect. The third semiconductor layers 314 and 324 are not necessarily provided, however, a high voltage TFT can be achieved as well as an improved reliability by providing the third semiconductor layers 314 and 324. In the case where the TFTs 301 and 302 are N-type transistors, an N-type conductivity can be obtained when forming the third semiconductor layers 314 and 324 without adding an impurity which imparts an N-type conductivity. Therefore, in the case of using N-type transistors for the TFTs 301 and 302, an impurity which imparts an N-type conductivity is not necessarily added to the third semiconductor layers 314 and 324. However, an impurity which imparts a P-type conductivity is added to the first semiconductor layers 312 and 322 for forming channel regions, so that the conductivity is as close to I-type as possible.

Wirings 315 and 325 are formed so as to cover the pairs of third semiconductor layers 314 and 324.

A first passivation layer 340 and a second passivation layer 341 are formed of insulating films so as to cover the TFTs 301 and 302 and the wirings 315 and 325. The number of passivation layers for covering the TFTs 301 and 302 is not limited to two, and a single layer or three or more layers may be used. For example, the first passivation layer 340 may be formed of silicon nitride and the second passivation layer 341 may be formed of silicon oxide. The passivation layers formed of silicon nitride or silicon oxide can prevent the TFTs 301 and 302 from degrading due to moisture and oxygen.

Either of the wirings 325 is connected to an anode 350 of the light emitting element 303. An electro luminescent layer 351 is formed on the anode 350, and a cathode 332 is formed on the electro luminescent layer 351.

When the first semiconductor layers 312 and 322 each including a channel forming region are formed by using a semi-amorphous semiconductor, a TFT which exhibits a higher mobility than a TFT using an amorphous semiconductor can be achieved. As a result, the driver circuit and the pixel portion can be integrally formed on the same substrate.

Described in this embodiment is the case where the driver circuit and the pixel portion of the light emitting device are integrally formed on the same substrate by using TFTs including a semi-amorphous semiconductor, though the invention is not limited to this. After a pixel portion is formed of TFTs using a semi-amorphous semiconductor, a driver circuit formed separately may be attached on a substrate on which the pixel portion is formed. Further, the first semiconductor layer including a channel may be formed of an amorphous semiconductor. In this case, however, a pixel portion is formed of TFTs using an amorphous semiconductor, and then a driver circuit formed separately is attached on a substrate on which the pixel portion is formed.

Embodiment 5

Figure 10A:
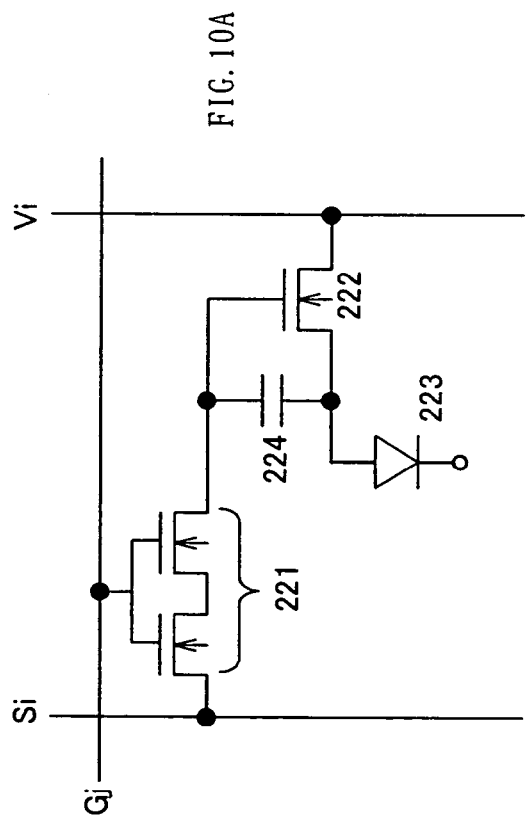
FIG. 10A is a circuit diagram of a pixel and FIG. 10B is a cross sectional view of the same.

Described next is a pixel configuration included in the light emitting device of the invention. FIG. 10A shows an example of a circuit diagram of a pixel, and FIG. 10B shows an example of a cross sectional structure of the pixel corresponding to FIG. 10A.

Figure 10B:
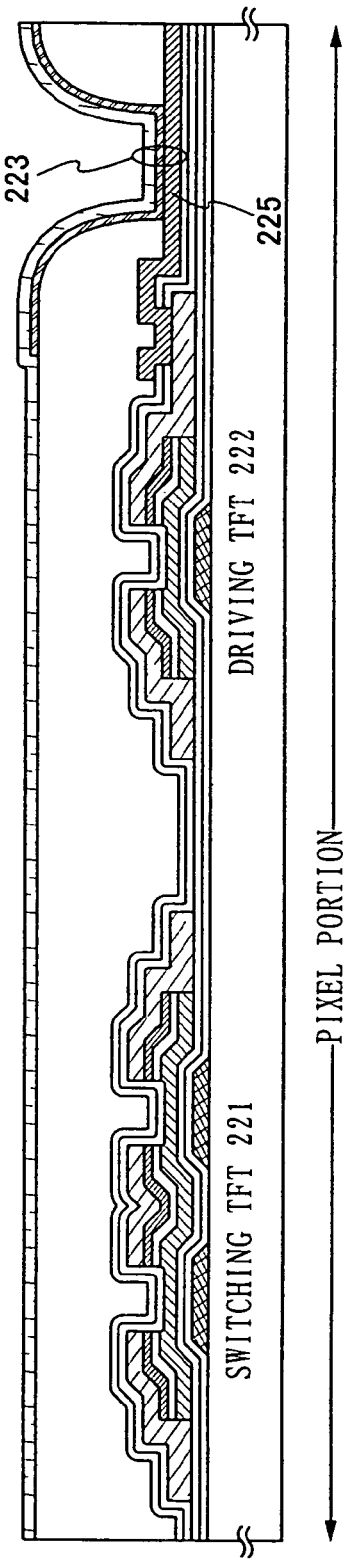

In FIGS. 10A and 10B, reference numeral 221 denotes a switching TFT for controlling a video signal input to the pixel, and 222 denotes a driving TFT for controlling a current supply to a light emitting element 223. Specifically, a drain current is controlled by a video signal inputted to the pixel via the switching TFT 221, and the drain current is supplied to the light emitting element 223. Reference numeral 224 denotes a capacitor for holding a gate voltage of the driving TFT 222 when the switching TFT 221 is OFF, and the capacitor 224 is not necessarily provided.

More specifically, a gate electrode of the switching TFT 221 is connected to a scan line Gj (j=1 to y), either a source region or a drain region thereof is connected to a signal line Si (i=1 to x), and the other thereof is connected to a gate electrode of the driving TFT 222. Either a source region or a drain region of the driving TFT 222 is connected to a power supply line Vi (i=1 to x) and the other thereof is connected to an anode 225 of the light emitting element 223. One of two electrodes of the capacitor 224 is connected to the gate electrode of the driving TFT 222 and the other thereof is connected to the anode 225 of the light emitting element 223.

In FIGS. 10A and 10B, the switching TFT 221 adopts a multi-gate structure in which a plurality of TFTs, which are connected in series and gate electrodes thereof are connected to each other, have a first semiconductor layer in common. By adopting the multi-gate structure, OFF current of the switching TFT 221 can be reduced. Although the switching TFT 221 has a structure in which two TFTs are connected in series with each other in FIGS. 10A and 10B, the invention can be applied to a multi-gate structure in which three or more TFTs are connected in series with each other and gate electrodes thereof are connected to each other. Further, the switching TFT 221 does not necessarily have a multi-gate structure, and a TFT of a single gate structure including a single gate electrode and channel forming region may also be employed Embodiment 6

A manufacturing method of the light emitting device of the invention is next described in more detail.

For a substrate 710, a plastic material can be used as well as glass, quartz and the like. Alternatively, an insulating layer may be formed on a metal material such as stainless and aluminum in order to obtain the substrate 710. A conductive layer for forming a gate electrode and a gate wiring (scan line) is formed on the substrate 710. For the conductive layer, a metal material such as chrome, molybdenum, titanium, tantalum, tungsten, and aluminum, or an alloy of these materials is used. The conductive layer can be formed by sputtering or vacuum vapor deposition.

The conductive layer is etched to form gate electrodes 712 and 713. The gate electrodes 712 and 713 preferably have tapered ends so that a first semiconductor layer and a wiring layer are formed thereon. In the case where the conductive layer is formed of an aluminum-based material, a surface thereof is preferably insulated by anodization and the like after the etching step. Although not shown, a wiring connected to the gate electrodes can be formed at the same time in this step.

Subsequently, a first insulating layer 714 and a second insulating layer 715 are formed over the gate electrodes 712 and 713 in order to function as gate insulating layers. In this case, it is preferable that the first insulating layer 714 is formed of a silicon oxide film whereas the second insulating layer 715 is formed of a silicon nitride film. These insulating layers can be formed by glow discharge decomposition or sputtering. In particular, in order to form an insulating layer having a high density and a small gate leakage current at a low deposition temperature, a reactive gas mixed with a noble gas element such as argon may be added into the insulating layer.

A first semiconductor layer 716 is formed over the first insulating layer 714 and the second insulating layer 715. The first semiconductor layer 716 is formed of a semi-amorphous semiconductor (SAS).

The SAS can be obtained by glow discharge decomposition of silicon gas. Typically, $SiH_4$ is used as a silicon gas, though $Si_2H_6$, $SiH_2Cl_2$, $SiHCl_3$, $SiCl_4$, $SiF_4$ or the like may be used as well. The formation of the SAS can be facilitated by using the silicon gas which is diluted by adding a single or a plurality of noble gas elements selected from among hydrogen, hydrogen and helium, argon, krypton, and neon. The silicon gas is preferably diluted with a dilution rate of 10 to 1000. It is needless to say that the reactive production of the film by glow discharge decomposition is performed under reduced pressure, but the pressure may be in the range of about 0.1 to 133 Pa. The power for generating the glow discharge is in the range of 1 to 120 MHz, and more preferably, an RF power in the range of 13 to 60 MHz may be supplied. The substrate is preferably heated at a temperature of 300° C. or less, and more preferably, 100 to 200° C.

The silicon gas may also be mixed with a carbon gas such as $CH_4$ and $C_2H_6$, or a germanium gas such as $GeH_4$ and $GeF_4$ to set the energy bandwidth in the range of 1.5 to 2.4 eV, or 0.9 to 1.1 eV.

When an impurity element for controlling valence electrons is not added to an SAS intentionally, the SAS exhibits a small N-type conductivity. This is because oxygen is easily mixed into a semiconductor layer since the glow discharge is performed at a higher power than in the case of forming an amorphous semiconductor.

When an impurity element which imparts a P-type conductivity is added to the first semiconductor layer including a channel forming region at the same time as or after the deposition, a threshold voltage can be controlled. Typically, boron is used for an impurity element which imparts a P-type conductivity. An impurity gas such as $B_2H_6$ and $BF_3$ may be mixed into the silicon gas at a rate of 1 to 1000 ppm. It is preferable that the concentration of boron is $1 \times 10^{14}$ to $6 \times 10^{16}$ atoms/cm$^3$.

Subsequently, a second semiconductor layer 717 and a third semiconductor layer 718 are formed (FIG. 11A). The second semiconductor layer 717 is formed without intentionally adding an impurity element for controlling valence electrons, and is preferably formed of an SAS as the first semiconductor layer 716. The second semiconductor layer 717 is disposed between the first semiconductor layer 716 and a third semiconductor layer 718 having one conductivity and forming a source and a drain, and thereby it functions as a buffer layer. Therefore, the second semiconductor layer 717 is not necessarily provided when the third semiconductor layer 718 has the same conductivity as the first semiconductor layer 716 having a small N-type conductivity. In the case where an impurity element which imparts a P-type conductivity is added to the third semiconductor layer 718 with the intention of controlling a threshold voltage, the second semiconductor layer 717 functions to gradually change the concentration of impurities, leading to a good joint formation. That is, the second semiconductor layer 717 is capable of serving as a lightly doped impurity region (LDD region) formed between a channel forming region and a source or a drain region in a TFT to be obtained.

The third semiconductor layer 718 having one conductivity may be added with phosphorous as a typical impurity element when forming an N-channel TFT. Specifically, an impurity gas such as $PH_3$ may be mixed into the silicon gas. The third semiconductor layer 718 having one conductivity can be formed of an SAS or an amorphous semiconductor as long as valence electrons can be controlled.

As set forth above, the forming steps from the first insulating layer 714 to the third semiconductor layer 718 having one conductivity can be sequentially performed without exposing them to the atmosphere. Accordingly, each layer can be formed while not contaminating each surface thereof with atmospheric elements or impurity elements existing in the atmosphere, leading to reduced variations in characteristics of TFTs.

Next, masks 719 are formed by using a photo resist. Then, the first semiconductor layer 716, the second semiconductor layer 717, and the third semiconductor layer 718 having one conductivity are etched to be patterned like islands (FIG. 11B).

Figure 1C:
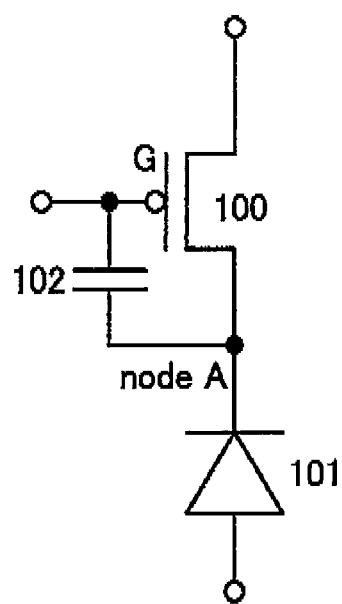
FIG. 1C is a diagram showing a connection of a driving TFT and a light emitting element.

A second conductive layer 720 is formed thereafter to form a wiring connected to the source and the drain. The second conductive layer 720 is formed of aluminum or an aluminum-based conductive material. Alternatively, the second conductive layer 720 may have a laminated structure in which a layer having contact with the semiconductor layer is formed of titanium, tantalum, molybdenum, tungsten, copper, or nitrides of these elements. For example, it is possible that the first layer is formed of Ta and the second layer is formed of W, the first layer is formed of TaN and the second layer is formed of Al, the first layer is formed of TaN and the second layer is formed of Cu, or the first layer is formed of Ti, the second layer is formed of Al, and the third layer is formed of Ti. Either the first layer or the second layer may be formed of an AgP-dCu alloy. Further, W, an alloy of Al and Si (Al—Si), and TiN may be sequentially laminated as well. Tungsten nitride may be used instead of W, an alloy of Al and Ti (Al—Ti) may be substituted for the alloy of Al and Si (Al—Si), or Ti may be used instead of TiN. Aluminum may be added with 0.5 to 5 atom % of an element such as titanium, silicon, scandium, neodymium, and copper in order to improve the heat resistance (FIG. 1C).

Figure 12A:
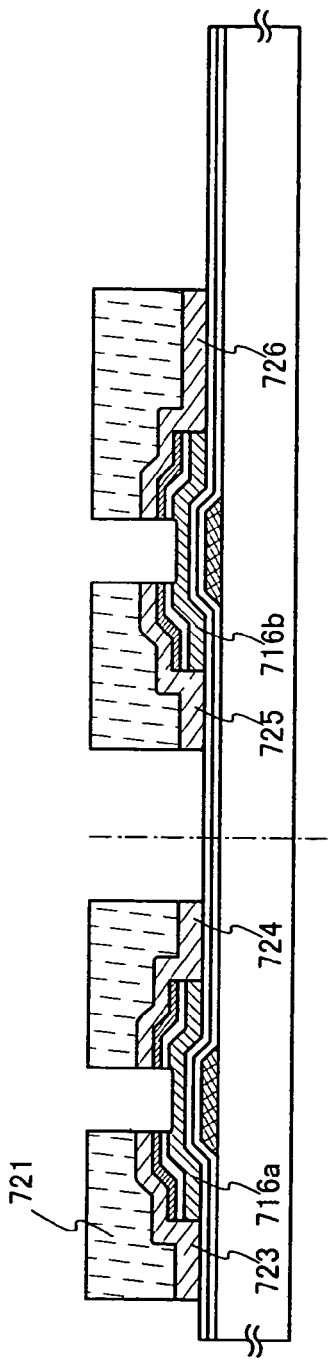
FIGS. 12A to 12C are diagrams each showing a manufacturing method of the light emitting device.

Subsequently, a mask 721 is formed. The mask 721 is patterned to form wirings connected to the source and the drain, and is also used as an etching mask for forming a channel forming region by removing the third semiconductor layer 718 having one conductivity. The conductive layer formed of aluminum or an aluminum-based material may be etched by the use of chloride gas such as $BCl_3$ and $Cl_2$. This etching process provides wirings 723 to 726. The channel forming region is formed by etching by the use of fluoride gas such as $SF_6$, $NF_3$, and $CF_4$. In this case, it is not possible to have etch selectivity relative to first semiconductor layers 716a and 716b which are to be used as base layers, therefore, processing time has to be adjusted appropriately. In this manner, a channel etched TFT can be obtained (FIG. 12A).

Next, a third insulating layer 727 for protecting the channel forming region is formed of a silicon nitride film. The silicon nitride film can be formed by sputtering or glow discharge decomposition, and is required to have a high density in order to block out pollutants in the atmosphere such as organic materials, metals, and moisture. By using the silicon nitride film for the third insulating layer 727, the concentration of oxygen in the first semiconductor layer 716 can be lowered to $5 \times 10^{19}$ atoms/cm$^3$ or less, more preferably $1 \times 10^{19}$ atoms/cm$^3$ or less. When the silicon nitride film is formed by RF sputtering using silicon as a target, the use of a sputtering gas in which a noble gas element such as argon is mixed with nitride promotes the higher density of the silicon nitride film. On the other hand, when the silicon nitride film is formed by glow discharge decomposition, the silicon nitride film is obtained by diluting a silicon gas by 100 to 500 times with a noble gas element such as argon. Thus, the silicon nitride film is capable of having a high density at a low temperature of 100° C. or less. Further, a fourth insulating layer 728 formed of a silicon oxide film may be laminated on the third insulating layer 727 as needed. The third insulating layer 727 and the fourth insulating layer 728 correspond to passivation layers.

Figure 12B:
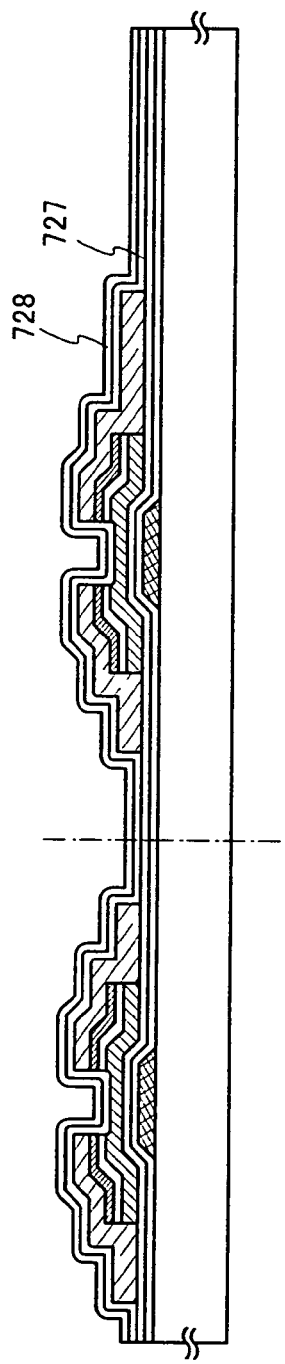

A planarizing layer 729 is formed on the third insulating layer 727 and/or the fourth insulating layer 728. The planarizing layer 729 is preferably formed of an organic resin such as acrylic, polyimide, and polyamide, or a siloxane-based insulating film having a Si—O bond and a Si—CHx bond. As these materials are hydrous, a sixth insulating layer 730 is preferably formed as a barrier film for preventing moisture absorption and release. The aforementioned silicon nitride film may be employed for the sixth insulating layer 730 (FIG. 12B).

Figure 12C:
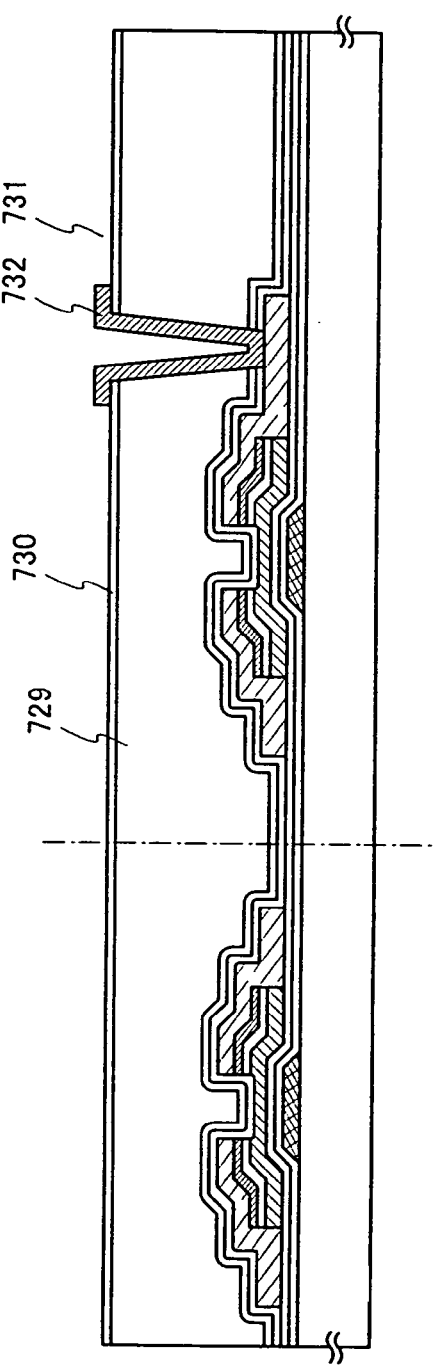

A wiring 732 is formed after a contact hole is formed through the sixth insulating layer 730, the planarizing layer 729, the third insulating layer 727, and the fourth insulating layer 728 (FIG. 12C).

The channel etched TFT formed in this manner, whose channel forming region is formed of an SAS, has a field effect mobility of 2 to 10 cm$^2$/V-sec.

Next, an anode 731 is formed on the sixth insulating layer 730 so as to be in contact with the wiring 732. For the anode 731, a transparent conductive film in which indium oxide is mixed with zinc oxide (ZnO) of 2 to 20% may be used as well as ITO, IZO, or ITSO. Alternatively, a titanium nitride film or a titanium film may also be used for the anode 731. In this case, after forming a transparent conductive film, a titanium nitride film or a titanium film is formed so as to be thin enough to transmit light (preferably, about 5 to 30 nm). In FIG. 13A, ITO is used for the anode 731. The anode 731 may be polished by CMP or by cleaning with porous body of polyvinyl alcohols so that the surface thereof is made flat. Further, the surface of the anode 731 may be processed with oxygen plasma or exposed to ultraviolet radiation after the polishing by CMP.

As shown in FIG. 13A, a bank 733 is formed over the sixth insulating layer 730 by using an organic resin film, an inorganic resin film or a siloxane-based material. Note that siloxane is a material which has a backbone structure formed by bonding of silicon (Si) and oxygen (O), and comprises at least hydrogen in its substituent. In addition, siloxane may also comprise one or more elements selected from fluorine, alkyl group, and aromatic hydrocarbon in its substituent. The bank 733 includes an opening portion at which the anode 731 is exposed. Then, as shown in FIG. 13B, an electro luminescent layer 734 is formed so as to be in contact with the anode 731 in the opening portion of the bank 733. The electro luminescent layer 734 may be formed of a single layer or a plurality of layers. In the case where the electro luminescent layer 734 has a laminated structure, a hole injection layer, a hole transporting layer, a light emitting layer, an electron transporting layer, and an electron injection layer are laminated in this order on the anode 731.

Subsequently, a cathode 735 is formed so as to cover the electro luminescent layer 734. The cathode 735 can be formed of a known material having a low work function, such as Ca, Al, CaF, MgAg, and AlLi. The anode 731, the electroluminescent layer 734 and the cathode 735 are overlapped with each other in the opening portion of the bank 733 to form a light emitting element 736.

Actually, when the light emitting device is completed up to the steps shown in FIGS. 13A and 13B, it is preferably sealed with a protective film (laminate film, ultraviolet curable resin film or the like) or a cover material which has high airtightness and less degasification, in order not to expose it to the atmosphere.

An element substrate in which both a pixel portion and a driver circuit are made up of the same type of TFTs can be formed by using five masks: a gate electrode forming mask, a semiconductor region forming mask, a wiring forming mask, a contact hole forming mask, and an anode forming mask.

Although the driver circuit and the pixel portion of the light emitting device are formed on the same substrate by using TFTs including a semi-amorphous semiconductor in this embodiment, the invention is not limited to this. The pixel portion may be formed of TFT using an amorphous semiconductor, and a driver circuit separately formed may be attached on a substrate on which the pixel portion is formed.

FIGS. 11A to 11C, FIGS. 12A to 12C, and FIGS. 13A and 13B show the manufacturing method of a TFT having the structure shown in FIG. 9A, though a TFT having the structure shown in FIG. 9B can be manufactured similarly. However, the TFT shown in FIG. 9B is different from that shown in FIGS. 11A to 11C, FIGS. 12A to 12C, and FIGS. 13A and 13B in that the channel protective layers 330 and 331 are formed over the first semiconductor layers 312 and 322 including an SAS so as to be overlapped with the gate electrodes 310 and 320, respectively.

In FIGS. 12A and 12B, after forming a contact hole in the third insulating layer (first passivation layer) and the fourth insulating layer (second passivation layer), an anode and a bank are formed. The bank may be formed of an organic resin such as acrylic, polyimide, and polyamide, or a siloxane-based insulating film having a Si—O bond and a Si—CHX bond. In particular, an opening portion is preferably formed on the anode by using a photosensitive material so that side walls of the opening portion have a continuous curvature.

Embodiment 7

Described in this embodiment is an example of a top plan view of the pixel shown in FIGS. 10A and 10B.

Figure 14:
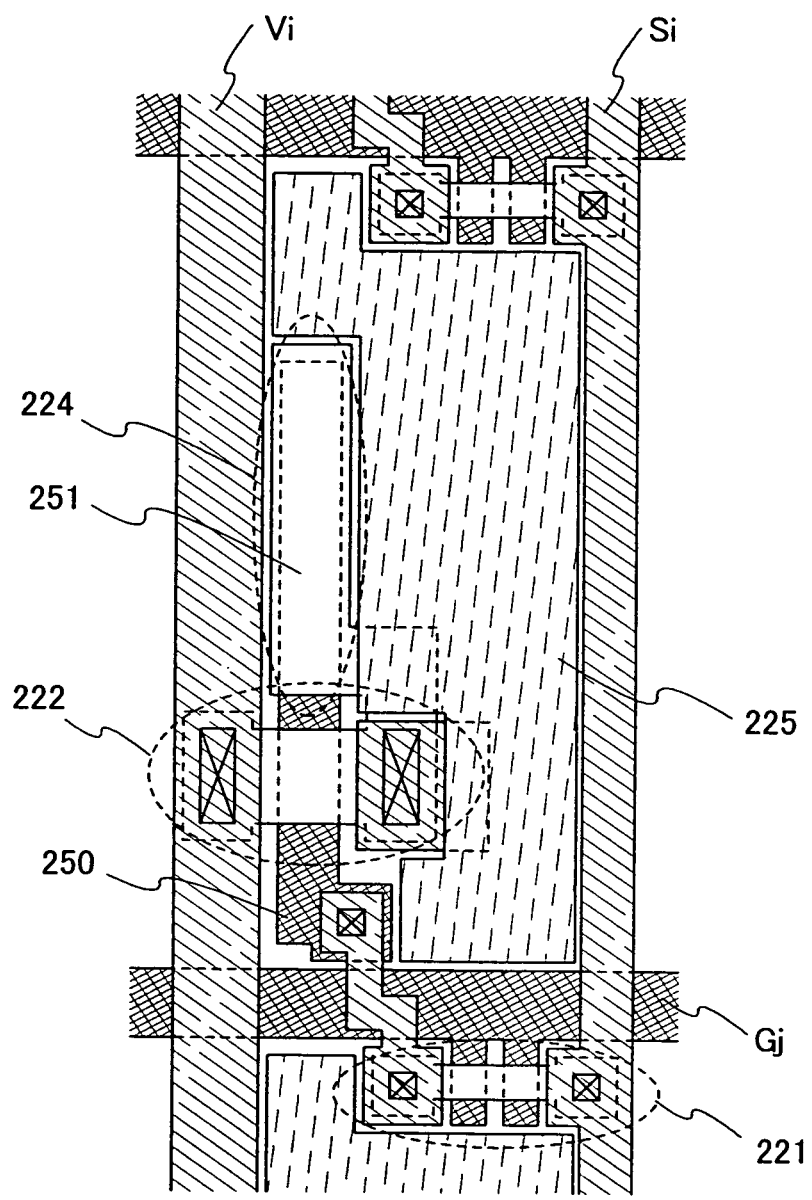
FIG. 14 is a top plan view of a pixel.

FIG. 14 is a top plan view of a pixel of this embodiment. Si, Vi, and Gj correspond to a signal line, a power supply line, and a scan line respectively. In this embodiment, the signal line Si and the power supply line Vi are formed of the same conductive layer. The scan line Gj and a wiring 250 are also formed of the same conductive layer. A part of the scan line Gj functions as a gate electrode of the switching TFT 221. A part of the wiring 250 functions as a gate electrode of the driving TFT 222 and another part thereof functions as a first electrode of the capacitor 224. A part 251 of an active layer of the driving TFT 222, which is on a side of an anode 225, functions as a second electrode of the capacitor 224. The capacitor 224 is formed of the part 251 of the active layer at the anode 225 side, a part of the wiring 250, and a gate insulating layer (not shown). Reference numeral 225 denotes the anode, and light is emitted in an overlapping area (light emitting area) of the anode 225, an electro luminescent layer and a cathode (both not shown).

It is needless to say that the top plan view shown in this embodiment is just an example and the invention is not limited to this Embodiment 8

An N-type transistor is used for a semi-amorphous TFT or an amorphous TFT used in the light emitting device of the invention. Described in this embodiment is a cross sectional structure of a pixel taking an N-type driving TFT as an example.

FIG. 15A is a cross sectional view of a pixel in which an N-type driving transistor 7001 is used and light from a light emitting element 7002 is emitted in the direction of a cathode 7003. In FIG. 15A, an electro luminescent layer 7004 and the cathode 7003 are laminated in this order on an anode 7005 which is electrically connected to the driving TFT 7001. The anode 7005 is preferably formed of a material which transmits light with difficulty, and for example, titanium nitride or titanium can be employed. The electro luminescent layer 7004 may be formed of either a single layer or a plurality of layers. The cathode 7003 may be formed of a known material as long as it is a conductive film having a low work function. For example, Ca, Al, CaF, MgAg, AlLi or the like is desirably used, however, it is formed so as to be thin enough to transmit light (preferably, about 5 to 30 nm). Al having a thickness of 20 nm may be utilized as the cathode 7003, for instance. Then, a transparent conductive layer 7007 is formed so as to cover the cathode 7003. For the transparent conductive layer 7007, a transparent conductive film in which indium oxide is mixed with zinc oxide (ZnO) of 2 to 20% may be used as well as ITO, IZO, or ITSO.

An overlapping area of the cathode 7003, the electro luminescent layer 7004 and the anode 7005 corresponds to a light emitting element 7002. In the case of the pixel shown in FIG. 15A, light from the light emitting element 7002 is emitted in the direction of the cathode 7003 as shown by an outline arrow.

FIG. 15B is a cross sectional view of a pixel in which an N-type driving transistor 7011 is used and light from a light emitting element 7012 is emitted in the direction of a cathode 7013. In FIG. 15A, an electro luminescent layer 7014 and the cathode 7013 are laminated in this order on an anode 7015 which is electrically connected to the driving TFT 7011. The anode 7015 is formed of a transparent conductive film which transmits light, and for example, a transparent conductive film in which indium oxide is mixed with zinc oxide (ZnO) of 2 to 20% may be used as well as ITO, IZO, or ITSO. The electro luminescent layer 7014 may be formed of either a single layer or a plurality of layers as in FIG. 15A. The cathode 7013 may be formed of a known material as long as it is a conductive film which has a low work function as in FIG. 15A, and reflects light.

An overlapping area of the anode 7015, the electro luminescent layer 7014, and the cathode 7013 corresponds to a light emitting element 7012. In the case of the pixel shown in FIG. 15B, light from the light emitting element 7012 is emitted in the direction of the anode 7015 as shown by an outline arrow.

FIG. 15C is a cross sectional view of a pixel in which an N-type driving TFT 7021 is used and light from a light emitting element 7022 is emitted in both the directions of an anode 7025 and a cathode 7023. In FIG. 15C, an electro luminescent layer 7024 and the cathode 7023 are laminated in this order on the anode 7025 which is electrically connected to the driving TFT 7021. The anode 7025 can be formed of a transparent conductive film which transmits light as in FIG. 15B, and the electro luminescent layer 7024 may be formed of either a single layer or a plurality of layers as in FIG. 15A. The cathode 7023 may be formed of a known material as long as it is a conductive film having a low work function, however, it is formed so as to be thin enough to transmit light. For example, Al having a thickness of 20 nm can be used as the cathode 7023.

An overlapping area of the cathode 7023, the electro luminescent layer 7024, and the anode 7025 corresponds to a light emitting element 7022. In the case of the pixel shown in FIG. 15C, light from the light emitting element 7022 is emitted in both the directions of the anode 7025 and the cathode 7023 as shown by an outline arrow.

Although the driving TFT is electrically connected to the light emitting element in this embodiment, other TFTs may be connected in series between the driving TFT and the light emitting element.

Note that in all the pixels shown in FIGS. 15A to 15C, a protective layer may be formed so as to cover the light emitting element. The protective layer is formed of a film which transmits a substance such as moisture and oxygen with difficulty as compared with other insulating films in order to prevent such a substance from being absorbed in the light emitting element and accelerating deterioration of the light emitting element. Typically, for example, a DLC film, a carbon nitride film, a silicon nitride film formed by RF sputtering are desirably used. It is also possible to use for the protective layer a laminated layer of a layer which transmits the moisture, the oxygen and the like with difficulty and a layer which transmits the moisture, the oxygen and the like with ease.

In order to obtain light from the cathode side in FIGS. 15B and 15C, ITO which is added with Li to lower the work function may be used instead of reducing the film thickness of the cathode.

The light emitting device of the invention is not limited to the structures shown in FIGS. 15A to 15C, and various changes based on the scope of the invention are possible.

Embodiment 9

Figure 16A:
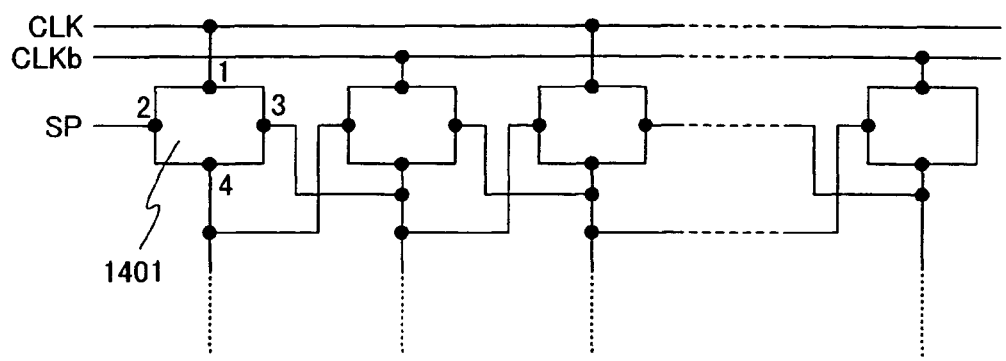
FIGS. 16A and 16B are diagrams each showing an example of a shift register.

Described in this embodiment is an example of a shift register using TFTs all of which has the same conductivity. A configuration of a shift register of this embodiment is shown in FIG. 16A. The shift register shown in FIG. 16A operates in accordance with a first clock signal CLK, a second clock signal CLKb, and a start pulse signal SP. Reference numeral 1401 denotes a pulse output circuit, and a specific configuration thereof is shown in FIG. 16B.

The pulse output circuit 1401 comprises TFTs 801 to 806 and a capacitor 807. A gate of the TFT 801 is connected to a node 2, a source thereof is connected to a gate of the TFT 805, and a drain thereof is supplied with a potential Vdd. A gate of the TFT 802 is connected to a gate of the TFT 806, a drain thereof is connected to the gate of the TFT 805, and a drain thereof is supplied with a potential Vss. A gate of the TFT 803 is connected to a node 3, a source thereof is connected to the gate of the TFT 806, and a drain thereof is supplied with the Vdd. A gate of the TFT 804 is connected to the node 2, a drain thereof is connected to the gate of the TFT 805, and a source thereof is supplied with the Vss. A gate of the TFT 805 is connected to one electrode of the capacitor 807, a drain thereof is connected to the node 1, and a source thereof is connected to the other electrode of the capacitor 807 and a node 4. A gate of the TFT 806 is connected to one electrode of the capacitor 807, a drain thereof is connected to the node 4, and a source thereof is supplied with the Vss.

Figure 16B:
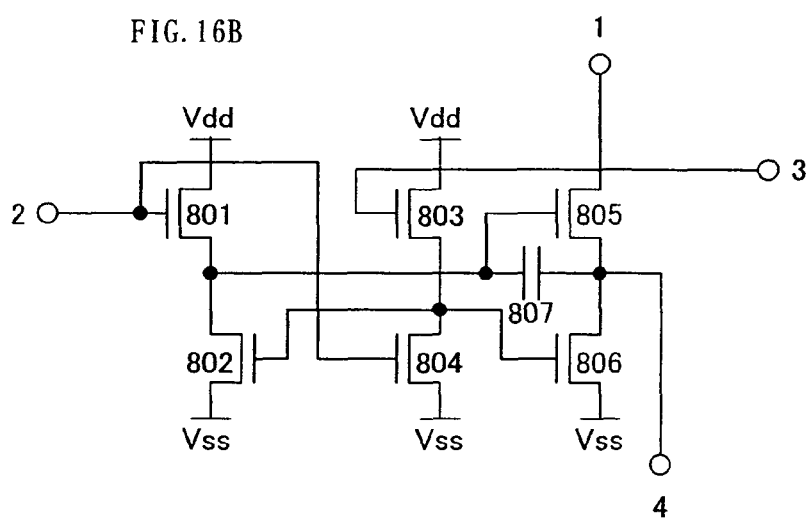

An operation of the pulse output circuit 1401 shown in FIG. 16B is described next. It is assumed herein that H level of the CLK, the CLKb, and the SP is Vdd and L level thereof is Vss. It is further assumed for simplicity that the Vss is equal to 0.

When the SP reaches H level, the TFT 801 is turned ON, and thus, a gate potential of the TFT 805 starts to rise. At the last, the TFT 801 is turned OFF and brought into a floating state when the gate potential of the TFT 805 becomes equal to Vdd−Vth (Vth is a threshold voltage of the TFTs 801 to 806). On the other hand, when the SP reaches H level, the TFT 804 is turned ON. As a result, gate potentials of the TFTs 802 and 806 drop to the Vss and the TFTs 802 and 806 are turned OFF. A gate potential of the TFT 803 is L level at this time and the TFT 803 is OFF.

Then, the SP becomes L level, the TFTs 801 and 804 are turned OFF, and thus the gate potential of the TFT 805 is maintained equal to Vdd−Vth. In the case where a gate-source voltage of the TFT 805 is higher than the threshold voltage Vth, the TFT 805 is turned ON.

Subsequently, when the CLK supplied to the node 1 is changed from L level to H level, the node 4, namely a source voltage of the TFT 805 starts to rise since the TFT 805 is ON. The gate and the source of the TFT 805 are capacitively coupled due to the capacitor 807, therefore, the gate potential of the TFT 805 which is in a floating state starts to rise again as the potential of the node 4 is increased. At the last, the gate potential of the TFT 805 becomes higher than Vdd+Vth, and the potential of the node 4 becomes equal to the Vdd. The aforementioned operation is performed similarly in the subsequent stages of the pulse output circuit 1401, and a pulse is outputted in sequence.

Embodiment 10

Figure 17A:
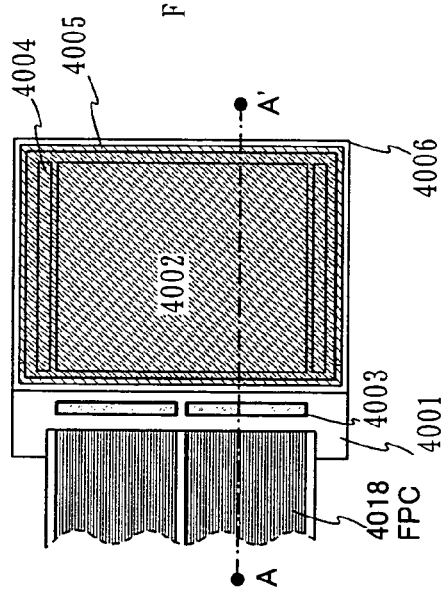
FIG. 17A is a top plan view of the light emitting device of the invention and FIG. 17B is a cross sectional view of the same.
Figure 17B:
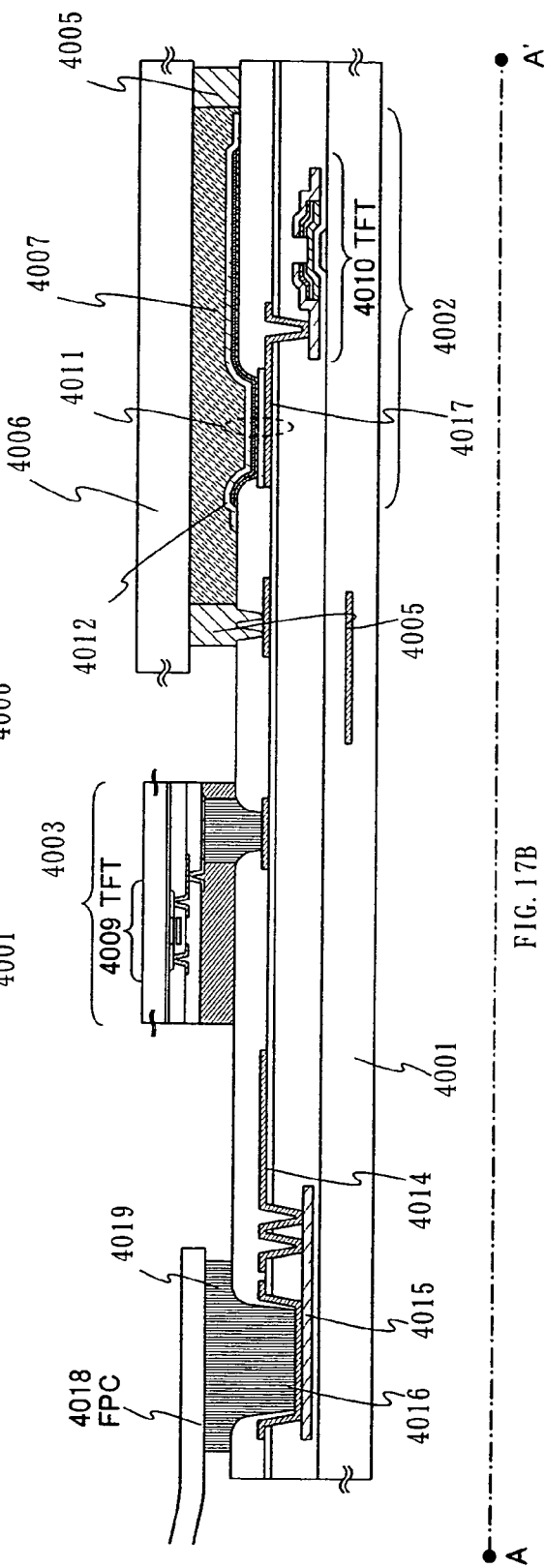

In this embodiment, an exterior of a panel which is one mode of the light emitting device of the invention is described with reference to FIGS. 17A and 17B. FIG. 17A is a top plan view of a panel in which a TFT and a light emitting element are formed on a first substrate and sealed with a sealing member interposed between the first substrate and a second substrate. FIG. 17B is a cross sectional view taken by cutting along a line A-A' of FIG. 17A.

Sealing members 4005 are provided so as to surround a pixel portion 4002 and a scan line driver circuit 4004 which are formed on a first substrate 4001. A second substrate 4006 is formed over the pixel portion 4002 and the scan line driver circuit 4004. Accordingly, the pixel portion 4002 and the scan line driver circuit 4004 as well as a filling member 4007 are sealed with the first substrate 4001, the sealing members 4005, and the second substrate 4006. In an area on the first substrate 4001, which is different from the area surrounded by the sealing members 4005, a signal line driver circuit 4003 formed on another substrate by using a polycrystalline semiconductor is mounted. In this embodiment, a signal line driver circuit formed of TFTs using a polycrystalline semiconductor is mounted on the first substrate 4001, however, a signal line driver circuit may be formed of a single crystalline semiconductor and mounted on the first substrate 4001. In FIG. 17B, a TFT 4009 formed of a polycrystalline semiconductor is shown as an example of a TFT included in the signal line driver circuit 4003.

The pixel portion 4002 and the scan line driver circuit 4004 formed on the first substrate 4001 comprise a plurality of TFTs, and a TFT 4010 included in the pixel portion 4002 is shown as an example in FIG. 17B. Note that, it is assumed in this embodiment that the TFT 4010 is a driving TFT. The TFT 4010 corresponds to a TFT using a semi-amorphous semiconductor.

Reference numeral 4011 corresponds to a light emitting element, and a pixel electrode of the light emitting element 4011 is electrically connected to a drain of the TFT 4010 via a wiring 4017. In this embodiment, a counter electrode of the light emitting element 4011 and a transparent conductive layer 4012 are electrically connected to each other. The structure of the light emitting element 4011 is not limited to the one shown in this embodiment. It may be changed arbitrarily depending on the direction of light emitted from the light emitting element 4011 and the conductivity of the TFT 4010.

Although not shown in the cross sectional view of FIG. 17B, various signals and potentials are supplied from a connecting terminal 4016 from the signal line driver circuit 4003 formed separately and the scan line driver circuit 4004 or the pixel portion 4002 via lead wirings 4014 and 4015.

In this embodiment, the connecting terminal 4016 is formed of the same conductive layer as the pixel electrode of the light emitting element 4011. The lead wiring 4014 is formed of the same conductive layer as the wiring 4017. Further, the lead wiring 4015 is formed of the same conductive layer as a gate electrode of the TFT 4010.

The connecting terminal 4016 is electrically connected to a terminal of an FPC 4018 via an anisotropic conductive layer 4019.

For the first substrate 4001 and the second substrate 4006, glass, metal (typically, stainless), ceramics, or plastic may be employed. As a plastic material, an FRP (Fiberglass-Reinforced Plastic) board, a PVF (Polyvinyl Fluoride) film, a mylar film, a polyester film, or an acrylic resin film may be used. Alternatively, an aluminum foil sandwiched between PVF films or mylar films may also be employed.

However, for the substrate which is in the direction to which light from the light emitting element is emitted, a light transmitting material is used such as a glass board, a plastic board, a polyester film, and an acrylic film.

For the filling member 4007, an ultraviolet curable resin or a heat-curable resin may be used as well as an inert gas such as nitrogen and argon. These resins include PCV (Polyvinyl Chloride), acryl, polylmide, epoxy resin, silicon resin, PVB (Polyvinyl Butyral), and EVA (Ethylene Vinyl Acetate). In this embodiment, nitrogen is used as the filling member 4007.

Although the signal line driver circuit 4003 is formed separately and mounted on the first substrate 4001 in FIG. 17, the invention is not limited to this configuration. The scan line driver circuit may be formed separately and mounted, or only a part of the signal line driver circuit or a part of the scan line driver circuit may be formed separately and mounted.

In this embodiment mode, the driver circuit and the pixel portion of the light emitting device are formed on the same substrate by using TFTs including a semi-amorphous semiconductor. However, the invention is not limited to this configuration. The pixel portion may be formed by using TFTs including an amorphous semiconductor and the driver circuit formed separately may be mounted on a substrate on which the pixel portion is formed.

This embodiment can be implemented in combination with the configurations described in other embodiments.

Embodiment 11

A light emitting device using a light emitting element emits light by itself, therefore, it has a high visibility in bright light and a wide viewing angle as compared with a liquid crystal display. Accordingly, it can be applied to display portions of various electronic apparatuses.

The light emitting device of the invention can be applied to various electronic apparatuses such as a video camera, a digital camera, a goggle type display (a head mounted display), a navigation system, an audio reproducing device (an in-car audio system, a component stereo, or the like), a notebook personal computer, a game player, a portable information terminal (a mobile computer, a mobile phone, a portable game player, an electronic book, or the like), and an image reproducing device provided with a recording medium (specifically, a device which is capable of reproducing a recording medium such as DVD (Digital Versatile Disc) and which includes a display for displaying the reproduced image). In particular, the light emitting device of the invention is desirably used for a portable electronic apparatus whose screen is often seen from an oblique direction and which requires a wide viewing angle. Further, according to the invention, a crystallization step after forming a semiconductor layer is not needed and thus a large panel can be formed with relative ease. Therefore, the light emitting device of the invention is so useful in forming electronic apparatuses which use a large panel having a size of 10 to 50 inches. Specific examples of such electronic apparatuses are shown in FIGS. 18A to 18C.

Figure 18A:
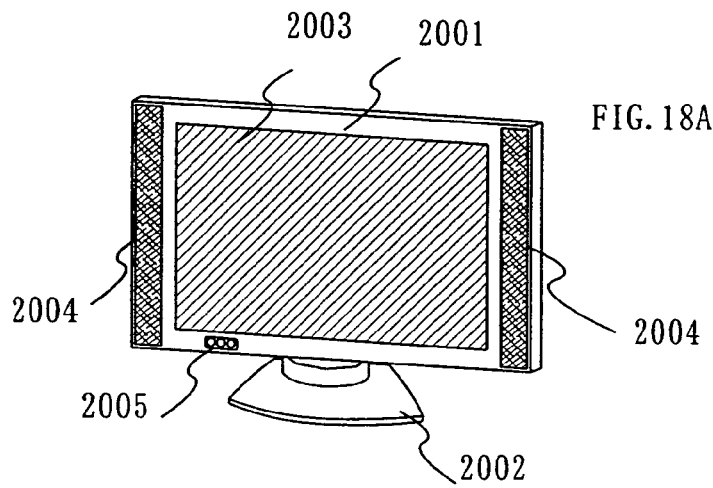
FIGS. 18A to 18C are views each showing an electronic apparatus using the light emitting device of the invention.

FIG. 18A shows a display device which includes a housing 2001, a supporting base 2002, a display portion 2003, speaker portions 2004, a video input terminal 2005 and the like. The light emitting device of the invention can be applied to the display portion 2003 to complete the display device of the invention. Since the light emitting device emits light by itself and requires no backlight, the display portion thereof can be made thinner than a liquid crystal display. It is to be noted that the light emitting display device includes all the information display devices such as one used for personal computer, TV broadcast receiving, or advertisement display.

Figure 18B:
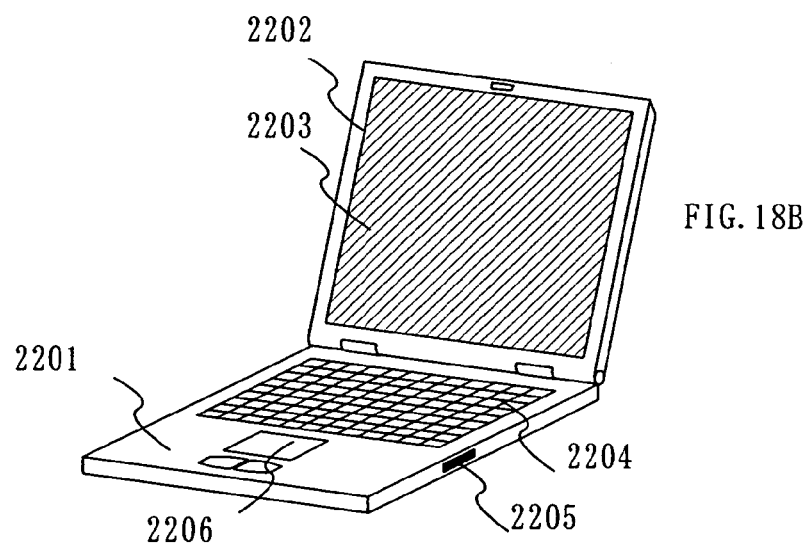

FIG. 18B shows a notebook personal computer which includes a main body 2201, a housing 2202, a display portion 2203, a keyboard 2204, an external connecting port 2205, a pointing mouse 2206 and the like. The light emitting device of the invention can be applied to the display portion 2203 to complete the notebook personal computer of the invention.

Figure 18C:
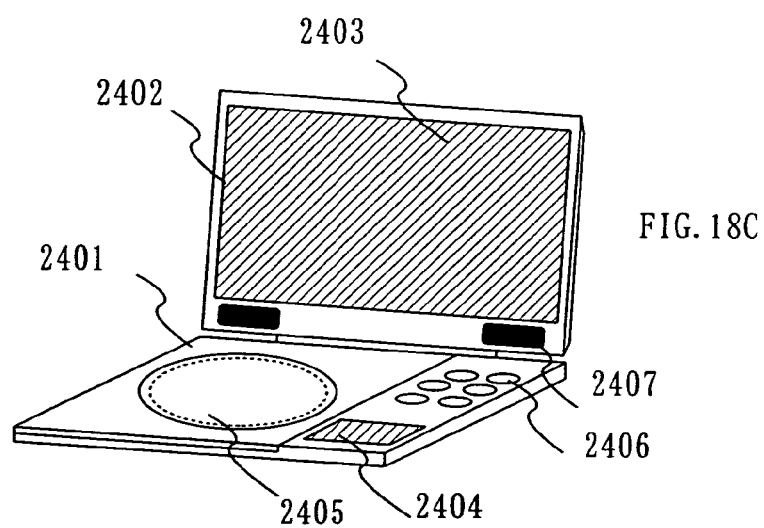
Figure 19A:
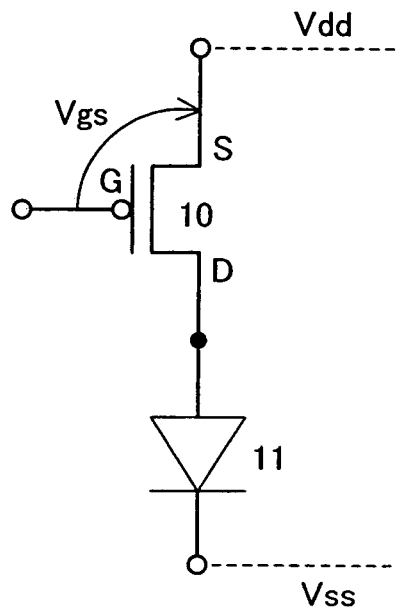
FIGS. 19A and 19B are diagrams each showing a connection of a driving TFT and a light emitting element.
Figure 19B:
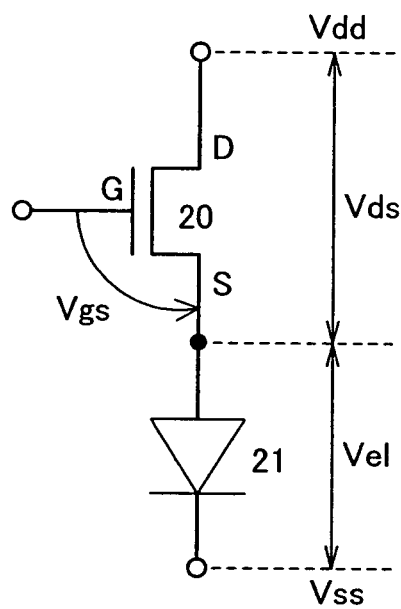

FIG. 18C shows a portable image reproducing device provided with a recording medium (specifically, a DVD reproducing device), which includes a main body 2401, a housing 2402, a display portion A 2403, a display portion B 2404, a recording medium (DVD and the like) reading portion 2405, an operating key 2406, a speaker portion 2407 and the like. The display portion A 2403 mainly displays image data whereas the display portion B 2404 mainly displays character data. It is to be noted that the image reproducing device provided with a recording medium includes a home video game player and the like. The light emitting device of the invention can be applied to the display portion A 2403 and the display portion B 2404 to complete the image reproducing device of the invention.

Since light emitting parts consume power in a light emitting device, data is desirably displayed so that the light emitting parts occupy as small area as possible. Accordingly, in the case where the light emitting device is used for a display portion which mainly displays character data, such as the one of a mobile phone or an audio reproducing device, it is preferably driven so that the character data emits light by using non-light emitting parts as background.

As set forth above, the application range of the invention is so wide that it can be applied to electronic apparatuses of all fields. The electronic apparatuses shown in this embodiment may include the light emitting device having any one of configurations described in Embodiments 1 to 10.

This application is based on Japanese Patent Application serial no. 2003-289569 filed in Japan Patent Office on 8, Aug., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A light emitting device comprising a light emitting element, first to third TFTs, and a power supply line,
wherein the first to the third TFTs are N-type TFTs;
one of a source and a drain of the first TFT is directly connected to a gate of the second TFT and a first one of two electrodes of a capacitor;
one of a source and a drain of the second TFT is connected to the power supply line and the other of the source and the drain of the second TFT is directly connected to an anode of the light emitting element and a second one of the two electrodes of the capacitor;
a gate of the third TFT is directly connected to the anode of the light emitting element, one of a source and a drain of the third TFT is directly connected to the power supply line and the other of the source and the drain of the third TFT is directly connected to the anode of the light emitting element; and
the gate of the third TFT is directly connected to the other of the source and the drain of the third TFT,
wherein a third potential having image data is supplied to the gate of the second TFT in a third period while a first potential is supplied to the one of the source and the drain of the second TFT from the power supply line and a second potential is supplied to a cathode of the light emitting element throughout a first period,
wherein the third period begins at a beginning of the first period or later and ends at an ending of the first period or earlier,
wherein a fourth potential is supplied to the one of the source and the drain of the second TFT from the power supply line and the second potential is supplied to the cathode of the light emitting element throughout a second period sequentially following the first period,
wherein the first potential is lower than the second potential and the fourth potential is higher than the second potential, and
wherein the light emitting element emits a light in the second period in accordance with image data supplied to the gate of the second TFT in the first period.

2. A light emitting device according to claim 1, wherein the first to the third TFTs are formed by using a semi-amorphous semiconductor.

3. A light emitting device according to claim 1, wherein the first to the third TFTs are formed by using an amorphous semiconductor.

4. A light emitting device comprising a light emitting element, first to fourth TFTs, and a power supply line,
wherein the first to the fourth TFTs are N-type TFTs;
one of a source and a drain of the first TFT is directly connected to a gate of the second TFT and a first one of two electrodes of a capacitor;
one of a source and a drain of the second TFT is connected to the power supply line and the other of the source and the drain of the second TFT is directly connected to an anode of the light emitting element and a second one of the two electrodes of the capacitor;
a gate of the third TFT is directly connected to the anode of the light emitting element, one of a source and a drain of the third TFT is directly connected to the power supply line and the other of the source and the drain of the third TFT is directly connected to the anode of the light emitting element;
one of a source and a drain of the fourth TFT is directly connected to the gate of the second TFT and the other of the source and the drain of the fourth TFT is directly connected to the anode of the light emitting element; and
the gate of the third TFT is directly connected to the other of the source and the drain of the third TFT,
wherein a third potential having image data is supplied to the gate of the second TFT in a third period while a first potential is supplied to the one of the source and the drain of the second TFT from the power supply line and a second potential is supplied to a cathode of the light emitting element throughout a first period,
wherein the third period begins at a beginning of the first period or later and ends at an ending of the first period or earlier,
wherein a fourth potential is supplied to the one of the source and the drain of the second TFT from the power supply line and the second potential is supplied to the cathode of the light emitting element throughout a second period sequentially following the first period,
wherein the first potential is lower than the second potential and the fourth potential is higher than the second potential, and
wherein the light emitting element emits a light in the second period in accordance with image data supplied to the gate of the second TFT in the first period.

5. A light emitting device according to claim 4, wherein the first to the fourth TFTs are formed by using a semi-amorphous semiconductor.

6. A light emitting device according to claim 4, wherein the first to the fourth TFTs are formed by using an amorphous semiconductor.

7. A light emitting device comprising a light emitting element, first to fourth TFTs, and a power supply line,
wherein the first to fourth TFTs are N-type TFTs;
one of a source and a drain of the first TFT is directly connected to a gate of the second TFT and a first one of two electrodes of a capacitor;
the second TFT and the third TFT are connected in series with each other between the power supply line and an anode of the light emitting element, wherein one of a source and a drain of the second TFT is directly connected to the anode of the light emitting element and a second one of the two electrodes of the capacitor, the other of the source and the drain of the second TFT is directly connected to one of a source and a drain of the third TFT, the other of the source and the drain of the third TFT is directly connected to the power supply line;
a gate of the fourth TFT is directly connected to the anode of the light emitting element, one of a source and a drain of the fourth TFT is directly connected to the power supply line and the other of the source and the drain of the fourth TFT is directly connected to the anode of the light emitting element; and the gate of the fourth TFT is directly connected to the other of the source and the drain of the fourth TFT, wherein a third potential having image data is supplied to the gate of the second TFT in a third period while a first potential is supplied to the one of the source and the drain of the second TFT from the power supply line and a second potential is supplied to a cathode of the light emitting element throughout a first period, wherein the third period begins at a beginning of the first period or later and ends at an ending of the first period or earlier, wherein a fourth potential is supplied to the one of the source and the drain of the second TFT from the power supply line and the second potential is supplied to the cathode of the light emitting element throughout a second period sequentially following the first period, wherein the first potential is lower than the second potential and the fourth potential is higher than the second potential, and wherein the light emitting element emits a light in the second period in accordance with image data supplied to the gate of the second TFT in the first period.

8. A light emitting device according to claim 7, wherein the first to the fourth TFTs are formed by using a semi-amorphous semiconductor.

9. A light emitting device according to claim 7, wherein the first to the fourth TFTs are formed by using an amorphous semiconductor.

10. A light emitting device according to claim 1, wherein the other of the source and the drain of the second TFT is directly connected to the other of the source and the drain of the third TFT.

11. A light emitting device according to claim 1, wherein a potential of the cathode of the light emitting element is kept constant in a writing period and a display period.

12. A light emitting device according to claim 4, wherein the other of the source and the drain of the second TFT is directly connected to the other of the source and the drain of the third TFT.

13. A light emitting device according to claim 4, wherein a potential of the cathode of the light emitting element is kept constant in a writing period and a display period.

14. A light emitting device according to claim 7, wherein the one of the source and the drain of the second TFT is directly connected to the other of the source and the drain of the fourth TFT.

15. A light emitting device according to claim 7, wherein a potential of the cathode of the light emitting element is kept constant in a writing period and a display period.

* * * * *